United States Patent
Sasanuma et al.

(10) Patent No.: US 6,252,894 B1
(45) Date of Patent: Jun. 26, 2001

(54) SEMICONDUCTOR LASER USING GALLIUM NITRIDE SERIES COMPOUND SEMICONDUCTOR

(75) Inventors: Katsunobu Sasanuma, Tokyo; Shinji Saito, Yokohama; Genichi Hatakoshi, Yokohama; Kazuhiko Itaya, Yokohama; Masaaki Onomura, Kawasaki; Risa Sugiura, Kawasaki; Mikio Nakasuji, Kawasaki; Hidetoshi Fujimoto, Kawasaki; Masahiro Yamamoto, Kawasaki; Shinya Nunoue, Ichikawa, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/263,213

(22) Filed: Mar. 5, 1999

(30) Foreign Application Priority Data

Mar. 5, 1998 (JP) .................................................. 10-053353

(51) Int. Cl.[7] ....................................................... H01S 5/00
(52) U.S. Cl. ............................................... 372/45; 372/44
(58) Field of Search ................................ 372/44, 45, 96

(56) References Cited

U.S. PATENT DOCUMENTS

| | | | | |
|---|---|---|---|---|
| 5,065,404 | * | 11/1991 | Okajima | 372/46 |
| 5,903,017 | * | 5/1999 | Itaya | 257/190 |
| 6,015,979 | * | 1/2000 | Sugiura | 257/86 |
| 6,028,877 | * | 2/2000 | Kimura | 372/46 |
| 6,147,364 | * | 11/2000 | Itaya | 257/76 |
| 6,172,382 | * | 1/2001 | Nagahama | 257/94 |

\* cited by examiner

Primary Examiner—Teresa M. Arroyo
Assistant Examiner—Gioacchino Inzirillo
(74) Attorney, Agent, or Firm—Oblon, Spivak, McClelland, Maier & Neustadt, P.C.

(57) ABSTRACT

A semiconductor laser is formed of gallium nitride series compound semiconductor and has a double hetero structure including an MQW (multiple quantum well) active layer held between p-type and n-type AlGaN clad layers. The double hetero structure is held between p-type and n-type contact layers. An InGaN optical absorption layer having an optical absorption coefficient larger than the clad layer which has the same conductivity type as the contact layer and is formed adjacent to the contact layer is formed in at least one of the contact layers and an InAlGaN optical guided mode control layer (layer of small refractive index) having an refractive index smaller than the clad layer is formed on the exterior of the optical absorption layer.

20 Claims, 16 Drawing Sheets

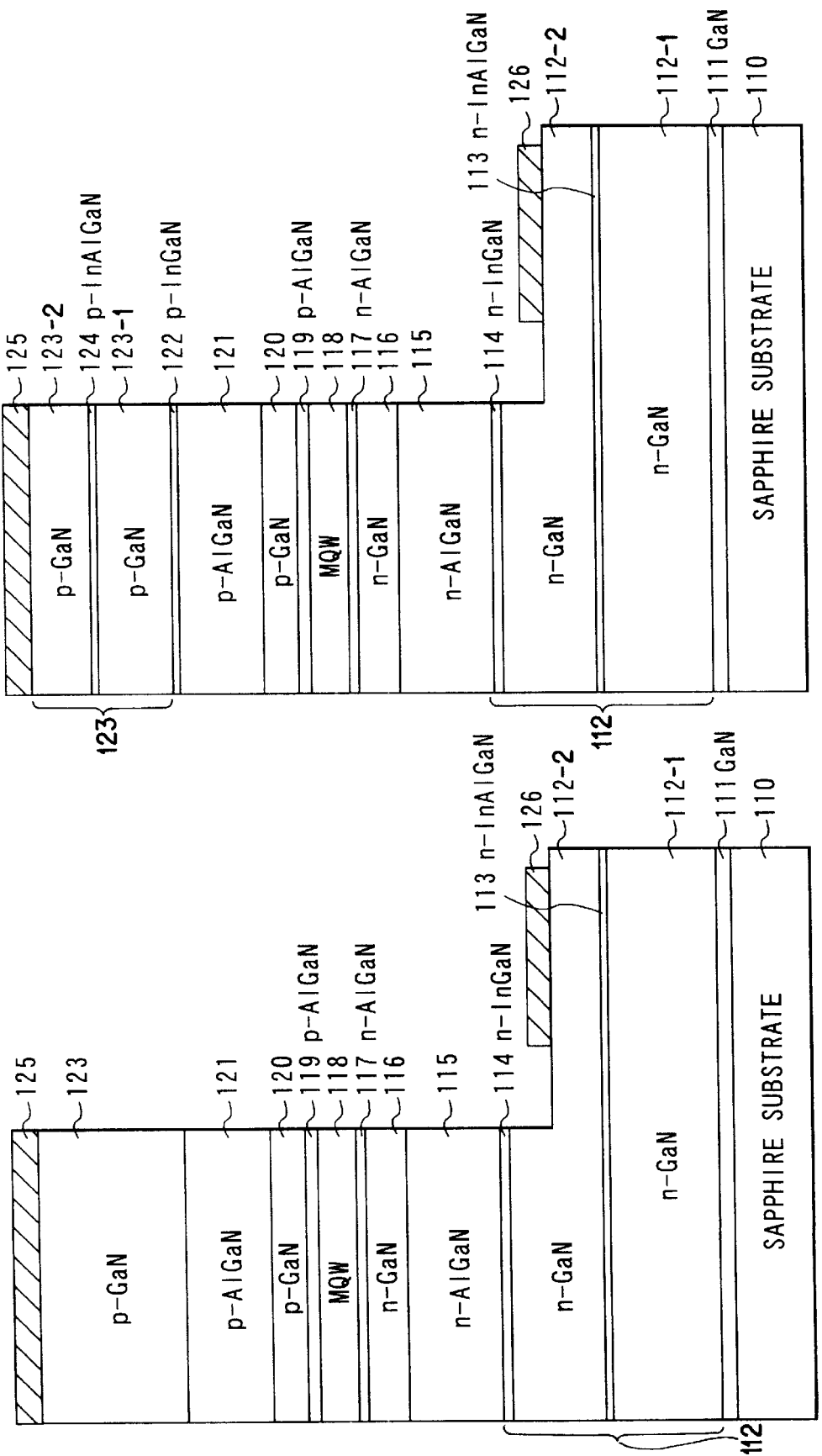

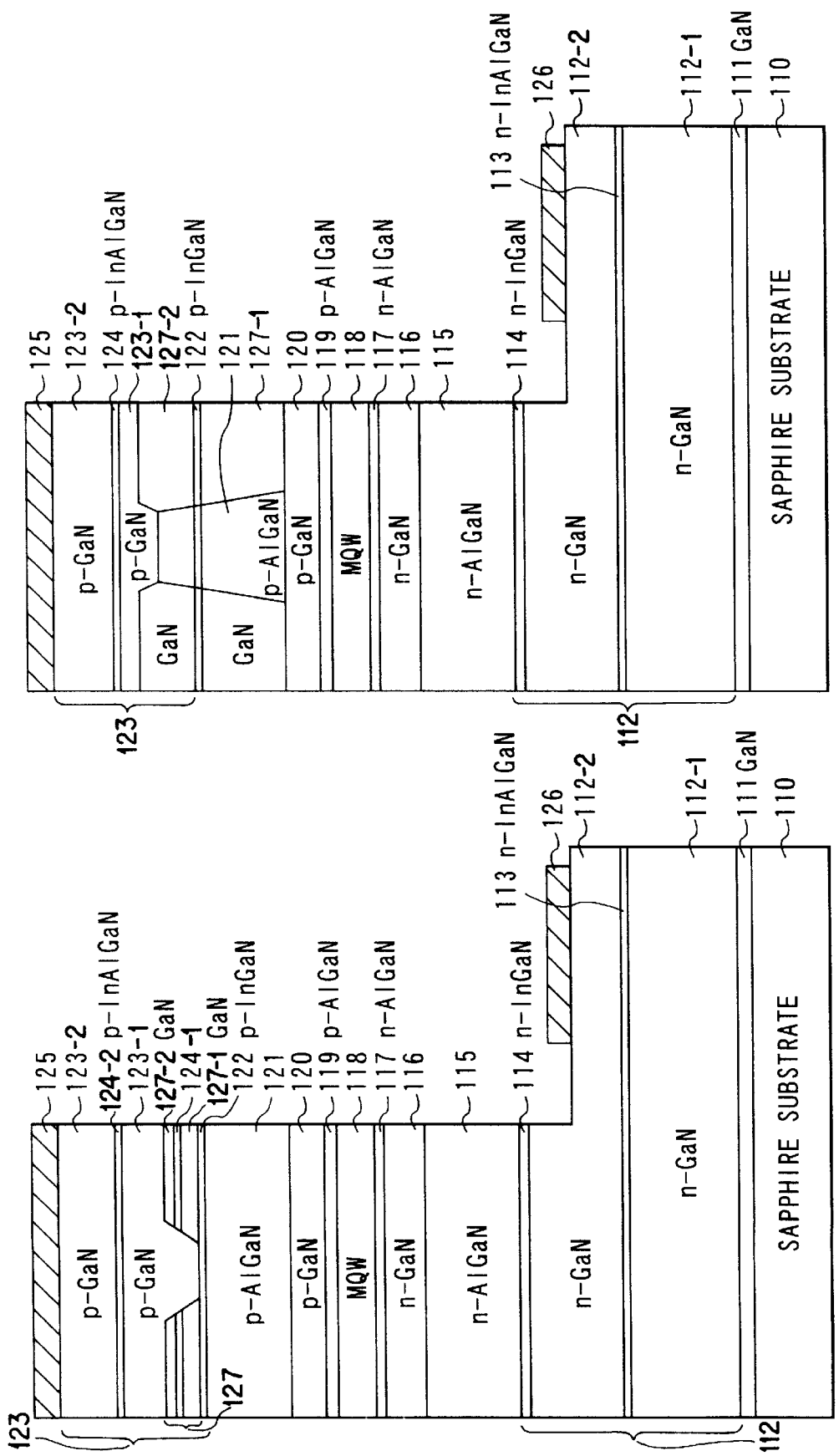

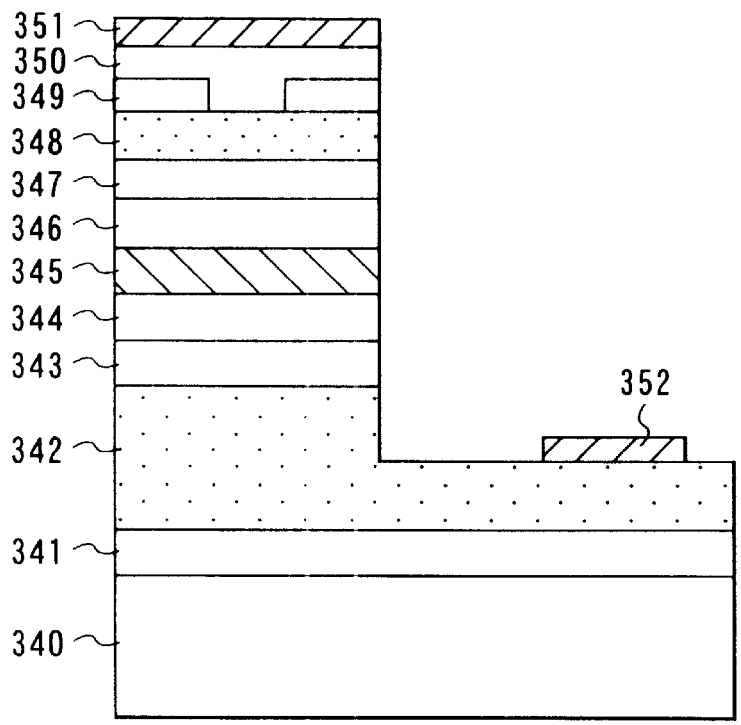
FIG. 15
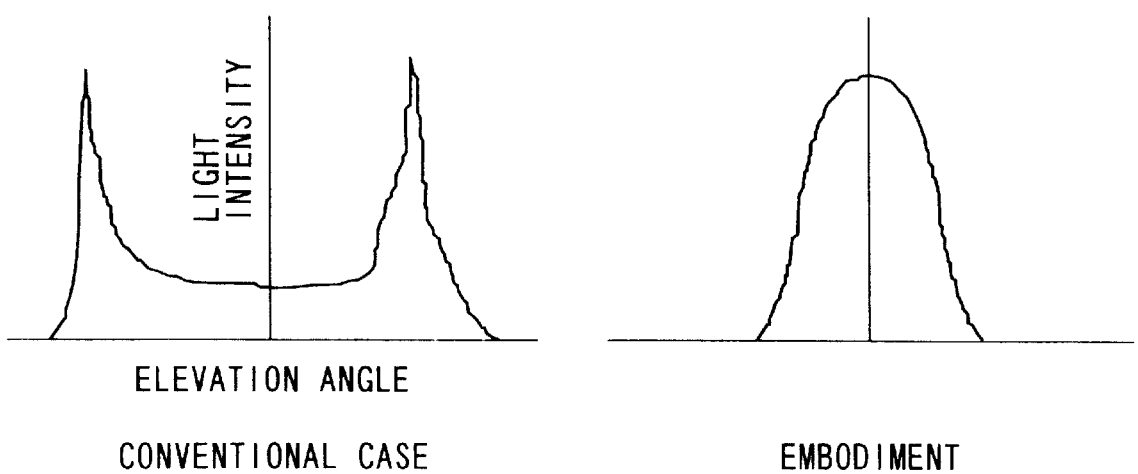
FIG. 16A
CONVENTIONAL CASE
FIG. 16B
EMBODIMENT

DEPENDENCY OF P CARRIER DENSITY OF CARRIER OVERFLOW
ON CLAD LAYER THICKNESS $d_{clad}$ DEPENDENCY OF P CARRIER DENSITY OF CARRIER OVERFLOW
ON GUIDE LAYER THICKNESS $d_{guide}$ DEPENDENCY OF P CARRIER DENSITY OF CARRIER OVERFLOW
ON GUIDE LAYER COMPOSITION $x_{guide}$

SEMICONDUCTOR LASER USING GALLIUM NITRIDE SERIES COMPOUND SEMICONDUCTOR

BACKGROUND OF THE INVENTION

This invention relates to a semiconductor laser using a compound semiconductor material and more particularly to a semiconductor laser using a gallium nitride series material.

Recently, gallium nitride series compound semiconductor materials such as GaN, InGaN, AlGaN and InAlGaN have received much attention as blue semiconductor laser materials. The semiconductor laser using the above material can generate a fine light beam by reducing the wavelength thereof and is expected as a light source for high density information processing in an optical disk or the like.

As a semiconductor laser of short wavelength, a light source of 600 nm band using an InGaAlP material is already put into practice and the characteristics thereof are improved such that data can be read out from and written into the optical disk. A blue semiconductor laser is actively developed to further enhance the recording density and the oscillation operation of a semiconductor laser using a II–VI group series material is confirmed. Further, a GaN series semiconductor laser can generate a beam of short wavelength which can be reduced to 350 nm or less, the continuous oscillation at room temperatures for more than several thousand hours is confirmed and the reliability thereof is high, and the reliability of more than ten thousand hours is confirmed in an LED, and thus the semiconductor laser is actively studied and developed.

However, in this type of semiconductor laser, since the threshold current density cannot be made lower than 1 kA/cm$^2$ and a far field pattern (which is hereinafter referred to as FFP) at the time of laser oscillation exhibits a multi-modal characteristic, a characteristic suitable for the light source of the optical disk or the like cannot be obtained.

In the conventional gallium nitride series semiconductor laser, since GaN is used for forming a contact layer and AlGaN is used for forming a clad layer, it oscillates in an anti-index guided mode. In the oscillation of anti-index guided mode, since FFP exhibits the multi-modal characteristic and a guided wave loss is large, an oscillation threshold value is generally large. Further, in the anti-index guided mode, since the effective refractive index in the laser oscillation is smaller than that of the contact layer, light leaks into the contact layer and the optical confinement coefficient of the contact layer becomes larger and a peak corresponding to the optical confinement of the contact layer occurs in FFP. This is the reason why the multi-modal characteristic occurs in FFP, and therefore, it is necessary to make the clad layer thick in order to reduce the leakage of light into the contact layer. As a result, the operation voltage in the laser oscillation becomes higher and a large number of cracks occur due to a difference in the lattice constant in crystallinity, thereby lowering the reliability.

In the case of a semiconductor laser with ridge structure formed of a GaN series material on a sapphire substrate, a phenomenon that light leaking from the clad layer is guided or a so-called anti-index guided mode phenomenon occurs since a GaN layer for the electrode contact on the exterior of the AlGaN clad is transparent with respect to oscillation light. Therefore, the oscillation due to a high-order vertical transverse mode having a smaller threshold current than the fundamental transverse mode tends to occur, a problem of kink of a light output due to mode competition by the adjacent high-order mode or a problem that it becomes difficult to focus the light by use of the lens occurs, and thus it is difficult to obtain characteristics suitable for the light source which can be used for the optical disk system.

That is, in the semiconductor laser using the gallium nitride series compound semiconductor material, since the contact layer lying between the clad layer and the electrode or substrate is formed of GaN, the clad layer is formed of AlGaN, the effective refractive index is smaller than that of GaN and oscillation occurs in the anti-index guided mode, then FFP exhibits the multi-modal characteristic, the guided wave loss is large and the oscillation threshold value becomes larger. Further, in the anti-index guided mode, since the optical confinement coefficient of the contact layer becomes larger, leakage of light causes FFP to have the multi-modal characteristic. In order to prevent this, it is necessary to increase the Al composition of the clad layer or make the clad layer thick, but as the result, cracks occur, the reliability is lowered and the operation voltage becomes higher, thereby making it difficult to provide an element which is used for the optical disk and is operated on a low voltage with a small threshold value and in which FFP exhibits the multi-modal characteristic.

Further, in a case where FFP is formed to exhibit a unimodal characteristic by forming an optical absorption layer of InGaN on the exterior of the clad layer and taking a measure for preventing leakage of light into the contact layer, it is inevitable that it oscillates in the high-order mode when it oscillates in the anti-index guided mode. At this time, since the oscillation threshold value in the high-order mode is approximately equal to the smallest oscillation threshold value, a problem that the mode order changes occurs at the time of oscillation and the oscillation frequency changes if the mode order changes, thereby causing a problem that the focus is deviated when laser light is focused by use of the lens. As a result, it becomes difficult to use the laser for reading or writing of the CD, DVD or the like.

In nitride series semiconductor, a hexagonal system crystal which grows on sapphire is obtained as the best crystal at present. A sapphire substrate is transparent in a range of 300 nm to a visible ray range and the refractive index thereof is smaller than that of GaN. In the conventional red semiconductor laser, since light which is not confined in the clad layer is absorbed by the substrate or electrode metal, light leaks into a portion other than the active layer is not almost present and the anti-index guided mode does not occur. However, in the nitride series semiconductor laser, since the sapphire substrate is used as the substrate, light leaks into a portion other than the active layer, a phenomenon called an anti-index guided mode in which a mode rises occurs and two or more peaks which cause a problem when it is used for the optical disk or laser projector occur in the far field pattern.

Thus, in order to provide a blue semiconductor laser which is used for the optical disk or the like and is operated on a low voltage with a small threshold value and high reliability and in which FFP exhibits the unimodal characteristic, it is important to solve the trade-off problems concerning the thickness and composition of the AlGaN clad layer, but at present, a construction which satisfactorily solves the problems is not yet provided. Since a transparent GaN layer with large refractive index is formed on the exterior of the AlGaN clad to attain the electrode contact, the vertical transverse mode is unstable irrespective of the current restricted structure and it is extremely difficult to attain a preferable beam characteristic.

BRIEF SUMMARY OF THE INVENTION

Accordingly, an object of this invention is to provide a gallium nitride series compound semiconductor laser which can suppress occurrence of cracks and enhance the reliability.

Further, another object of this invention is to provide a gallium nitride series compound semiconductor laser which is used for an optical disk or the like and is operated on a low voltage with the small threshold value and in which FFP exhibits the unimodal characteristic.

The above object can be attained by a semiconductor laser using gallium nitride series compound semiconductor and having a double hetero structure including an active layer held between clad layers of different conductivity types, comprising contact layers of different conductivity types formed to hold the double hetero structure, the conductivity types of the clad layer and contact layer adjacent to each other being the same; and at least one light leakage preventing layer formed in at least one of the contact layers and having an optical property different from that of the contact layer, for preventing light from leaking from the clad layer into the contact layer.

With the above construction, a plurality of layers having optically different properties are formed in the contact layers which are formed to hold the clad layer constructing the double hetero structure therebetween and disposed in the loop portion so as to make it difficult for the mode to rise, suppress the oscillation in the high-order mode and make it possible for FFP to exhibit the unimodal characteristic. As a plurality of layers having optically different properties, for example, a light absorption layer such as an InGaN layer or a layer of small refractive index such as an AlGaN layer with small refractive index is used. That is, by forming the light absorption layer or the layer of small refractive index in the contact layer of GaN or the like, the amount of light leaking into the contact layer is small at the time of oscillation in the anti-index guided mode, and as a result, the guided wave loss becomes small, the oscillation threshold value becomes small and FFP can exhibit the unimodal characteristic at the time of oscillation.

Further, by forming layers having optically different properties such as the light absorption layer or the layer of small refractive index in the contact layer, the oscillation in the high-order mode is suppressed, and by forming the contact layer with the super lattice structure, an element having less cracks and a low operation voltage can be obtained. By forming layers having optically different properties such as the light absorption layer or the layer of small refractive index in the contact layer) the mode order can be fixed in the case of oscillation in the high-order mode and deviation of focusing can be prevented when light is focused by use of the lens in a case where it is used as the light source of CD or DVD and a more practical laser element can be provided.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a cross sectional view showing the element structure of a semiconductor laser according to a second embodiment of this invention;

FIG. 8 is a cross sectional view showing the element structure of a semiconductor laser according to a third embodiment of this invention;

FIG. 9 is a cross sectional view showing the element structure of a semiconductor laser according to a fourth embodiment of this invention;

FIG. 10 is a cross sectional view showing the element structure of a semiconductor laser according to a fifth embodiment of this invention;

FIG. 15 is a cross sectional view showing the schematic structure of a blue semiconductor laser according to a tenth embodiment of this invention;

FIG. 16A is a diagram showing FFP at the time of oscillation in the conventional blue semiconductor laser;

FIG. 16B is a diagram showing FFP at the time of oscillation in the blue semiconductor laser according to the eighth embodiment of this invention;

DETAILED DESCRIPTION OF THE INVENTION

[First Embodiment]

Figure 1:
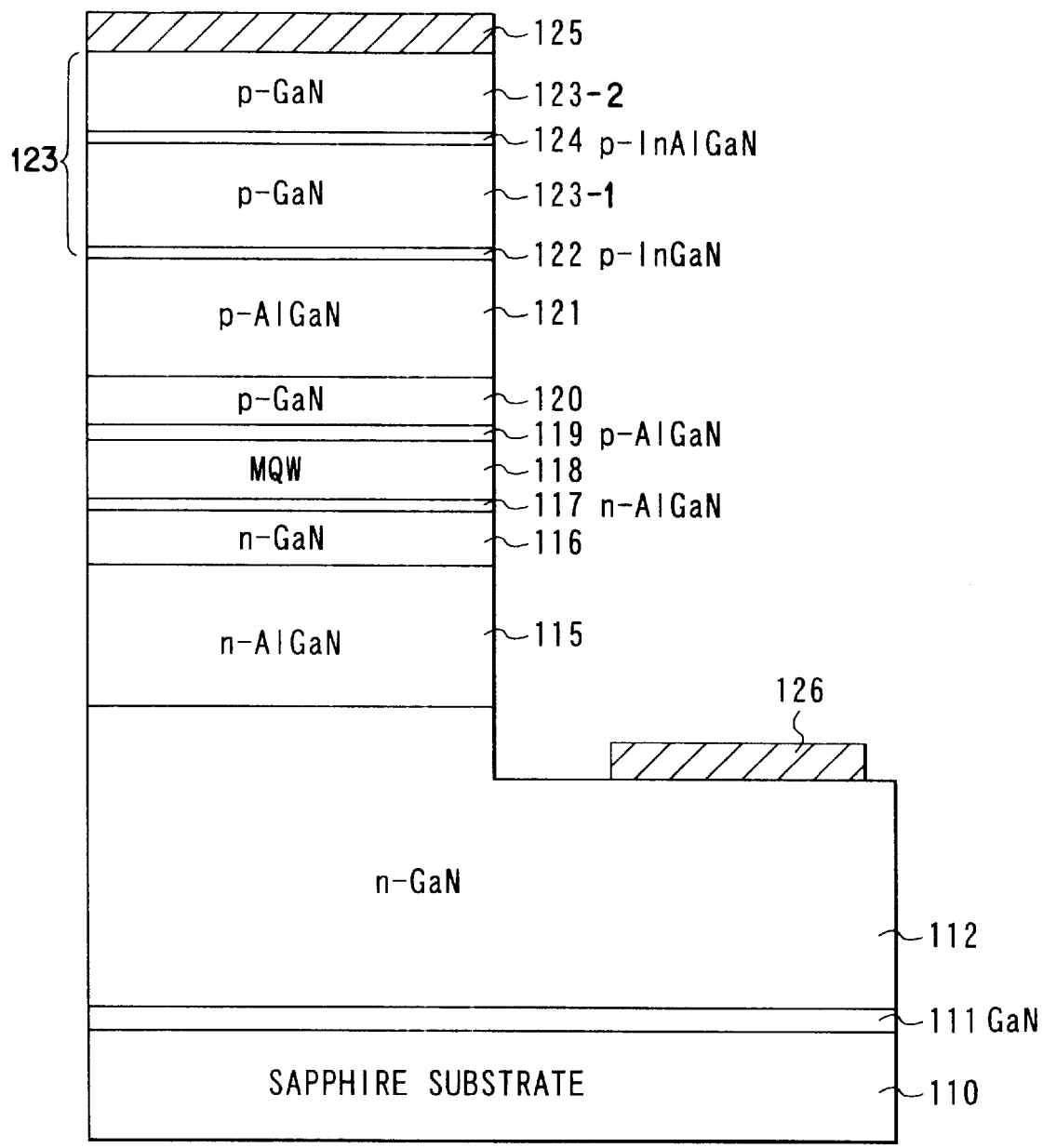
FIG. 1 is a cross sectional view showing the element structure of a semiconductor laser according to a first embodiment of this invention.

FIG. 1 is a cross sectional view showing the element structure of a semiconductor laser according to a first embodiment of this invention.

On a sapphire substrate 110, a buffer layer 111, n-type contact layer 112, n-type clad layer 115, n-type guide layer 116, n-type thin film barrier layer 117, active layer 118, p-type thin film barrier layer 119, p-type guide layer 120, p-type clad layer 121, p-type optical absorption layer 122, p-type contact layer 123-1, p-type optical guided mode control layer (layer of small refractive index) 124 and p-type contact layer 123-2 are sequentially grown and formed. For example, the buffer layer 111 is formed of GaN, the n-type contact layer 112 is formed of Si doped n-GaN and the n-type clad layer 115 is formed of Si doped n-AlGaN. Further, the n-type guide layer 116 is formed of Si doped n-GaN and the n-type thin film barrier layer 117 is formed of Si doped n-AlGaN. The active layer 118 has a multiple quantum well (MQW) structure constructed by a periodic structure in which two types of InAlGaN layers having a thickness of 10 nm or less are alternately disposed. The p-type thin film barrier layer 119 is formed of Mg doped p-AlGaN, the p-type guide layer 120 is formed of Mg doped p-GaN and the p-type clad layer 121 is formed of Mg doped p-AlGaN. Further, the p-type optical absorption layer 122 is formed of Mg doped InGaN, the p-type contact layers 123-1, 123-2 are formed of Mg doped GaN and the p-type optical guided mode control layer 124 is formed of Mg doped p-InAlGaN.

A portion ranging from the p-type contact layer 123-2 to the intermediate portion of the n-type contact layer 112 is partly etched and an n-side electrode (contact metallization) 126 is formed on the exposed surface of the n-type contact layer 112. Further, a p-side electrode (contact metallization) 125 is formed on the p-type contact layer 123-2.

In the optical absorption layer 122, it is preferable that the In composition thereof is higher than the In composition of the well layer of the MQW active layer 118, but even if it is lower, the free carrier loss is increased to increase the absorption coefficient by doping various types of metal impurities or doping Si, Zn, Mg with high impurity concentration ($1 \times 10^{18}$ cm$^{-3}$ or more). The thickness of the optical absorption layer 122 is set to 0.3 μm or less. As the optical guided mode control layer 124, a material having a large absorption coefficient like the optical absorption layer 122 is used or a material whose refractive index is made smaller than that of GaN by using AlGaN is used.

In FIG. 1, one layer of the optical guided mode control layer 124 is formed in the p-type contact layer 123, but if two or more layers are formed, the effect thereof can be made more significant. For example, the p-type contact layer 123 may be formed with the super lattice structure of AlGaN and/or InGaN and GaN. If the p-type contact layer 123 is formed with the super lattice structure, it is preferable to effect the modulation doping in order to reduce the resistance-of series-connected resistors in the vertical direction of the layer. Further, it is possible to form only one of the optical absorption layer 122 and the optical guided mode control layer 124. For example, a case wherein the optical absorption layer 122 is not formed and the optical guided mode control layer 124 is formed in the GaN contact layer 123 may be provided.

As in the first embodiment, if the optical absorption layer 122 and/or optical guided mode control layer 124 is formed, a large amount of light can be prevented from leaking into the contact layer 123, the oscillation in the high-order mode can be suppressed so as to cause the far field pattern (FFP) to exhibit a unimodal characteristic, and the threshold value can be reduced even in a state in which the thickness of the AlGaN clad layer is insufficient and light leaks into the contact layer 123. If this invention is not used, the near field pattern (NFP) is obtained as shown in FIG. 2.

Figure 2:
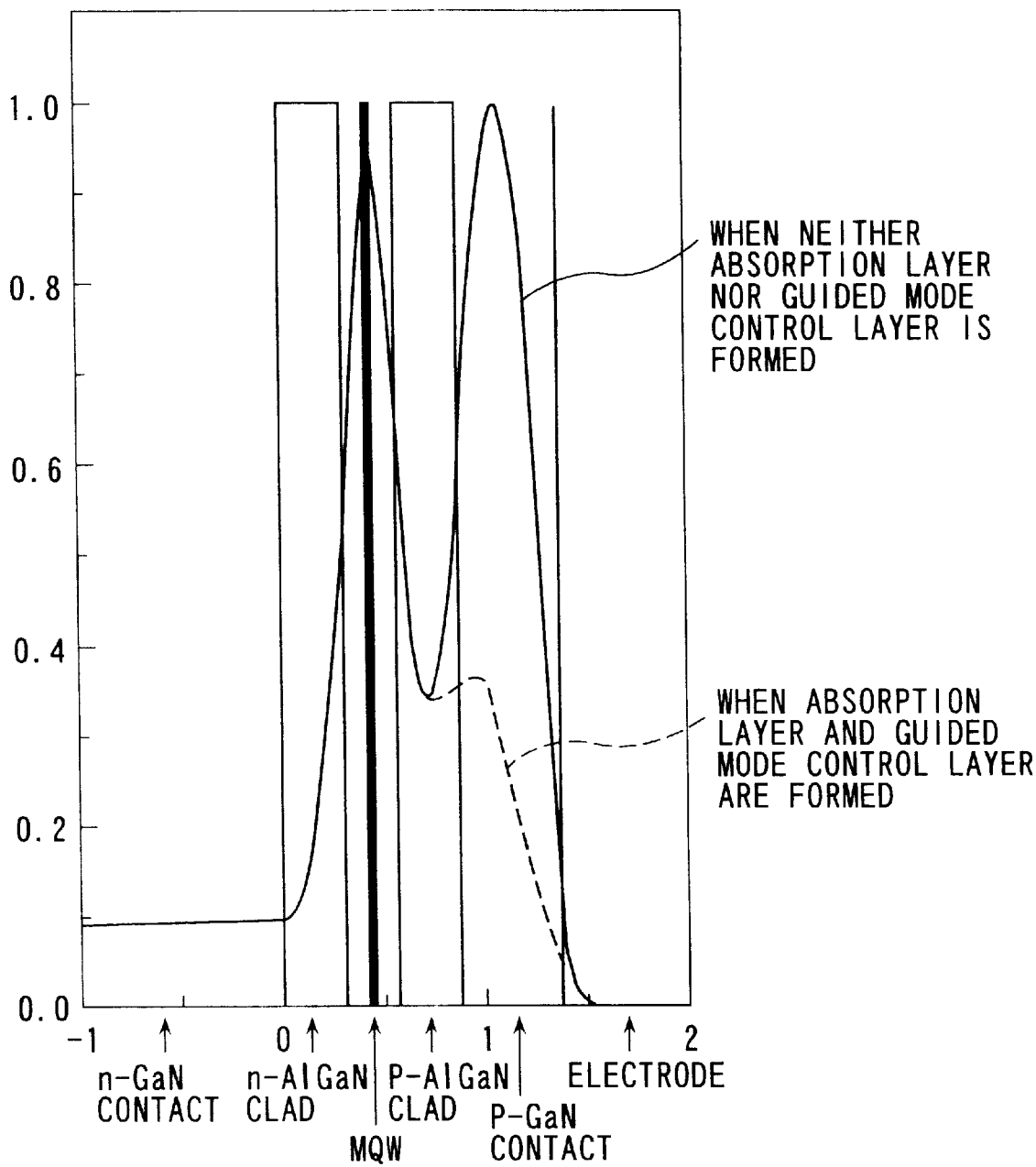
FIG. 2 is diagram showing the position dependency of a near field pattern (NFP)
Figure 3:
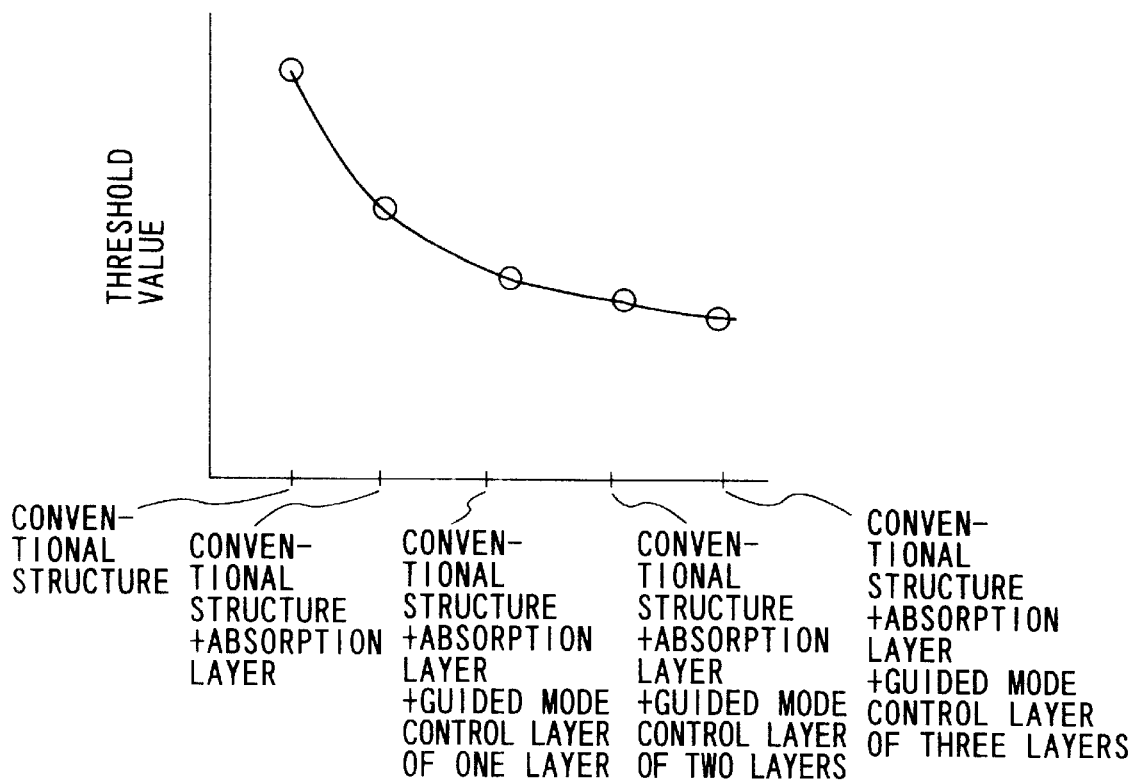
FIG. 3 is a diagram showing a variation in the threshold value when a light absorption layer and guided mode control layer are formed.

If the optical absorption layer 122 and optical guided mode control layer 124 are formed in the p-type contact layer 123, NFP is obtained as shown by broken lines in FIG. 2, the amount of light leaking into the p-type contact layer 123 is reduced and the oscillation threshold value is reduced. As shown in FIG. 3, the oscillation threshold value becomes smaller when the optical absorption layer 122 is formed in comparison with the conventional structure in which neither of the optical absorption layer 122 and optical guided mode control layer 124 is formed and the threshold value is more reduced as the number of layers of the optical guided mode control layer 124 is larger.

Figure 4:
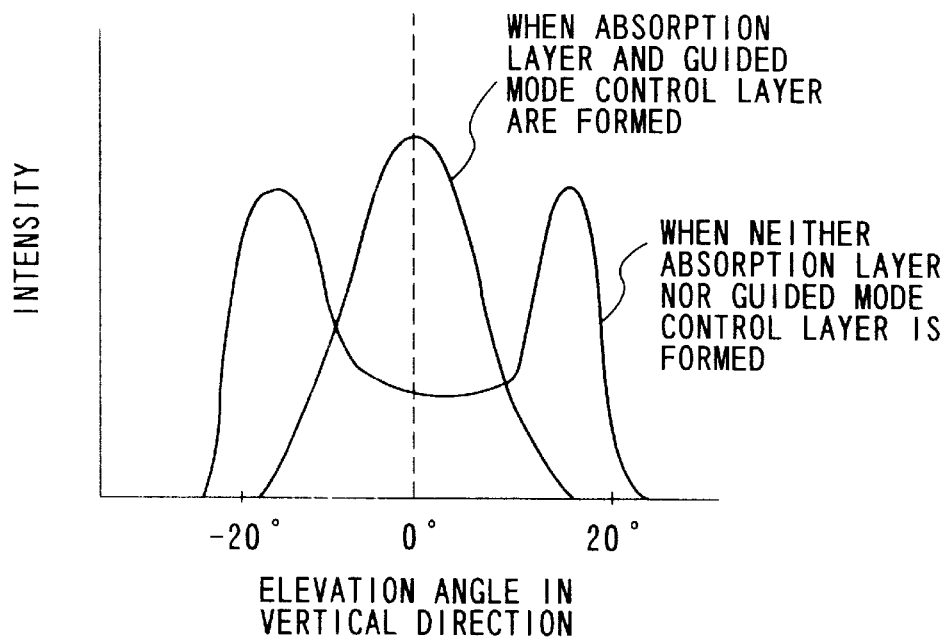
FIG. 4 is a diagram showing a far field pattern (FFP) in this invention in comparison with FFP in the conventional structure.
Figure 5:
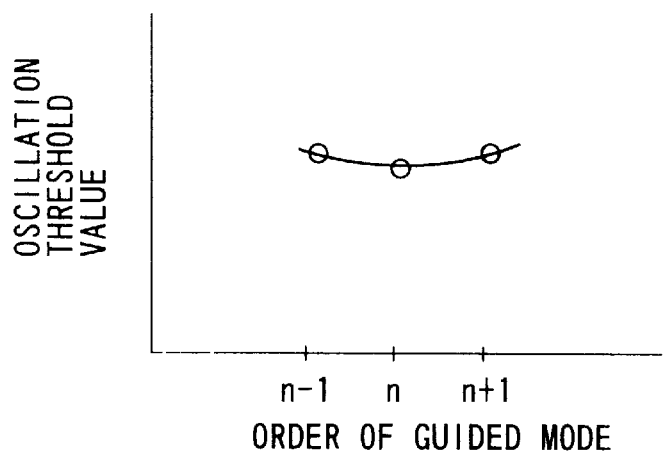
FIG. 5 is a diagram showing a variation in the threshold value due to a change in the order at the time of high-order oscillation.

If FFP obtained in the case of this embodiment in which the optical absorption layer 122 and optical guided mode control layer 124 are used and FFP obtained in the case in which neither of them is used are compared with each other, the result of comparison as shown in FIG. 4 is obtained. As is clearly understood from FIG. 4, FFP exhibiting the multi-modal characteristic in the conventional case exhibits the unimodal characteristic in this embodiment. The multi-modal characteristic is caused because light leaks into the p-GaN contact layer 123 and n-GaN contact layer 112 and the laser oscillation occurs in the high-order mode. However, as in this embodiment, if the optical absorption layer 122 and optical guided mode control layer 124 are formed in the contact layer 123, the oscillation in the high-order mode is suppressed so as to cause FFP to exhibit the unimodal characteristic.

Figure 6:
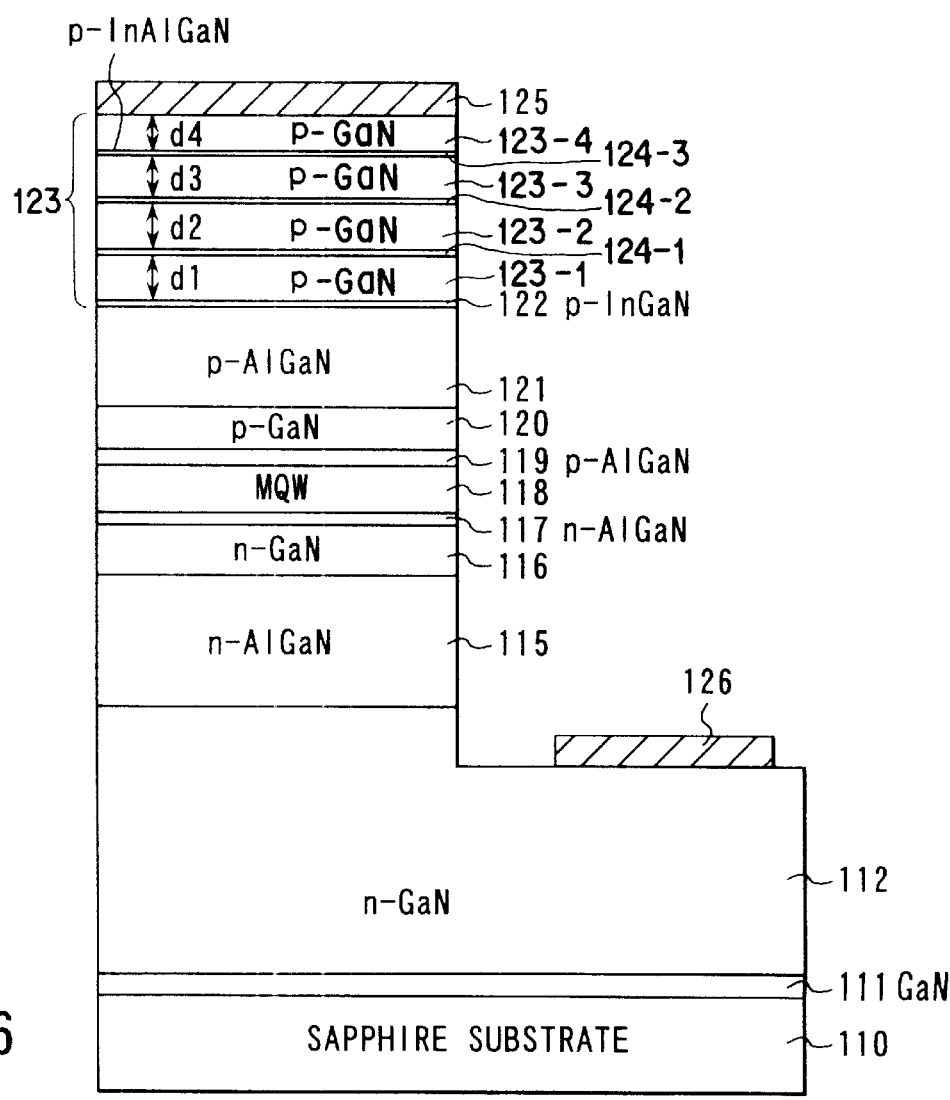
FIG. 6 is a view showing the intervals of respective layers in a case where a plurality of optical guided mode control layers are formed in the semiconductor laser according to the first embodiment.

Further, even if the optical absorption layer is formed, the oscillation may occur in the high-order mode in some cases if light absorption is insufficient because the In composition is not high or the doping concentration is low. In this case, the following two methods for solving this problem can be proposed. One method is to arrange the mode control layers 124-1 to 124-4 at irregular intervals in the contact layer 123 (123-1 to 123-4) so as to suppress occurrence of the high-order mode and the relation of d1≠d2≠d3≠d4 is set in the case of FIG. 6. In this case, a case in which each of the above values is an integral multiple of a certain value d0 is excluded. If the optical absorption layers 122 or mode control layers 124-1 to 124-4 are not periodically formed, the oscillation due to the high-order mode can be suppressed. Another method is to arrange the mode control layers 124-1 to 124-4 at a regular interval in the contact layer 123 (123-1 to 123-4) so as to provide only a particular high-order mode. For example, in FIG. 6, the relation of d1≠d2≠d3≠d4 is set. In this case, a case in which each of the above values is an integral multiple of a certain value d0 is included.

The oscillation due to the high-order mode cannot be prevented by use of the latter method, but occurrence of a problem that the order of the high-order mode fluctuates at the time of laser oscillation can be prevented. Conventionally, if the order of the high-order mode is changed, the oscillation frequency is changed and the laser light characteristic is changed to change the focusing operation by use of the lens, and therefore, it is not preferable that the order of the high-order mode is changed at the time of laser oscillation from the viewpoint of practical use. When the optical absorption layers 122 or mode control layers 124-1 to 124-4 are arranged at a regular interval in the contact layer 123, the node and loop of the waveguide mode can be fixed so that the order of the high-order mode can be fixed, thereby preventing occurrence of the above problem.

The semiconductor laser of this embodiment thus obtained continuously oscillates at room temperatures with the wavelength approximately equal to 420 nm, the threshold current density thereof is 1 kA/cm² or less and FFP exhibits the unimodal characteristic at the time of laser oscillation.

According to this embodiment, the p-InGaN optical absorption layer 122 and p-InAlGaN optical guided mode control layer 124 having different optical properties (different compositions) from the contact layer 123 are formed in the p-GaN contact layer 123 between the p-AlGaN clad layer 121 and the p-side electrode (contact metallization) 125 to reduce the amount of light leaking into the contact layer 123, suppress the oscillation due to the high-order mode, and as a result, suppress occurrence of the multi-modal characteristic of FFP at the time of laser oscillation. Further, by periodically arranging the optical guided mode control layers 124-1 to 124-4, the order of the mode can be fixed and a fluctuation in the mode at the time of laser oscillation can be suppressed. By the above effects, it is possible to provide a gallium nitride series compound semiconductor laser with high reliability which is operated on a low voltage with the small threshold value and which can be used for an optical disk or the like.

[Second Embodiment]

FIG. 7 is a cross sectional view showing the element structure of a semiconductor laser according to a second embodiment of this invention. In FIG. 7, portions which are the same as those of FIG. 1 are denoted by the same reference numerals and the detail explanation thereof is omitted.

On a sapphire substrate 110, a buffer layer 111, n-type contact layer 112-1, n-type optical guided mode control layer (layer of small refractive index) 113, n-type contact layer 112-2, n-type optical absorption layer 114, n-type clad layer 115, n-type guide layer 116, n-type thin film barrier layer 117, active layer 118, p-type thin film barrier layer 119, p-type guide layer 120, p-type clad layer 121 and p-type contact layer 123 are sequentially grown and formed. The buffer layer 111 is formed of GaN, the n-type contact layer 112-1, 112-2 are formed of Si doped n-GaN, and the n-type optical guided mode control layer 113 is formed of Si doped n-InAlGaN. Further, the n-type optical absorption layer 114 is formed of Si doped n-InGaN, the n-type clad layer 115 is formed of Si doped n-AlGaN, the n-type guide layer 116 is formed of Si doped n-GaN and the n-type thin film barrier layer 117 is formed of Si doped n-AlGaN. The active layer 118 has a multiple quantum well (MQW) constructed by a periodic structure in which two types of InAlGaN layers having a thickness of less than 10 nm are alternately laminated. The p-type thin film barrier layer 119 is formed of Mg doped p-AlGaN, the p-type guide layer 120 is formed of Mg doped p-GaN, the p-type clad layer.121 is formed of Mg doped p-AlGaN and the p-type contact layer 123 is formed of Mg doped GaN.

A portion ranging from the p-type contact layer 123 to the intermediate portion of the n-type contact layer 112-2 is partly etched, an n-side electrode (contact metallization) 126 is formed on the exposed surface of the n-type contact layer 112-2 and a p-side electrode (contact metallization) 125 is formed on the p-type contact layer 123.

In the optical absorption layer 114, it is preferable that the In composition thereof is higher than the In composition of the well layer of the MQW active layer 118, but even if it is lower, the free carrier loss is increased to increase the absorption coefficient by doping various types of metal impurities with high impurity concentration. As the optical guided mode control layer 113, a material having a large absorption coefficient like the optical absorption layer 114 is used or a material whose refractive index is made smaller than that of GaN by use of AlGaN is used.

In FIG. 7, one layer of the optical guided mode control layer 113 is formed in the n-type contact layer 112, but it is possible to form two or more layers. Further, if the n-type contact layer 112 is formed with a super lattice structure of AlGaN and/or InGaN and GaN, the same effect can be attained. If the contact layer 112 is formed with the super lattice structure, it is possible to effect the modulation doping in order to reduce the resistance of series-connected resistors in the vertical direction of the layer. Further, it is possible to form only one of the optical absorption layer 114 and the optical guided mode control layer 113. For example, this includes a case wherein the optical absorption layer 114 is not formed and the optical guided mode control layer 113 is formed in the GaN contact layer 112.

As in this embodiment, if the optical absorption layer 114 and/or optical guided mode control layer 113 is formed, a large amount of light can be prevented from leaking into the contact layer 112, the oscillation due to the high-order mode can be suppressed so as to cause the far field pattern (FFP) to exhibit a unimodal characteristic, and the-threshold value can be reduced even in a state in which the thickness of the AlGaN clad layer is insufficient and light leaks into the contact layer 112. If this embodiment is not used, a large amount of light leaks into the n-type contact layer 112 when viewing NFP, but if the optical absorption layer 114 and optical guided mode control layer 113 are formed in the n-type contact layer 112, light leaking into the n-type contact layer 112 is reduced and the oscillation threshold value is reduced.

In the conventional structure, PFP exhibits the multi-modal characteristic and the multi-modal characteristic is caused because light leaks into the p-GaN contact layer 123 and n-GaN contact layer 112 and the laser oscillation occurs in the high-order mode. However, as in this embodiment, if the optical absorption layer 114 and optical guided mode control layer 113 are formed in the n-type contact layer 112, FFP exhibits the unimodal characteristic.

Further, even if the optical absorption layer 114 is formed, the oscillation may occur in the high-order mode in some cases when light absorption is insufficient because the doping concentration is low or the In composition is not high. In this case, the following two methods for solving this problem can be proposed. One method is to arrange the mode control layers 113 at irregular intervals in the contact layer 112 so as to suppress occurrence of the high-order mode. If the optical absorption layers 114 or mode control layers 113 are not periodically formed, the oscillation due to the high-order mode can be suppressed. Another method is to arrange the mode control layers 124 at a regular interval in the contact layer 112 so as to provide only a particular high-order mode.

The oscillation due to the high-order mode cannot be prevented by the latter method, but occurrence of a problem that the order of the high-order mode fluctuates at the time of laser oscillation can be prevented. Conventionally, if the order of the high-order mode is changed, the oscillation frequency is changed and the laser light characteristic is changed to change the focusing operation by use of the lens, and therefore, it is not preferable that the order of the high-order mode is changed at the time of laser oscillation from the viewpoint of practical use. When the optical absorption layers 114 or mode control layers 113 formed of layers with small refractive index are arranged at a regular interval in the contact layer 112, the node and loop of the waveguide mode can be fixed so that the order of the high-order mode can be fixed, thereby preventing occurrence of the above problem.

The semiconductor laser of this embodiment thus obtained continuously oscillates at room temperatures with the wavelength approximately equal to 420 nm, the threshold current density thereof is 1 kA/cm$^2$ or less and FFP exhibits the unimodal characteristic at the time of laser oscillation.

[Third Embodiment]

FIG. 8 is a cross sectional view showing the element structure of a semiconductor laser according to a third embodiment of this invention. In FIG. 8, portions which are the same as those of FIG. 1 are denoted by the same reference numerals and the detail explanation thereof is omitted.

On a sapphire substrate 110, a buffer layer 111, n-type contact layer 112-1, n-type optical guided mode control layer (layer of small refractive index) 113, n-type contact layer 112-2, n-type optical absorption layer 114, n-type clad layer 115, n-type guide layer 116, n-type thin film barrier layer 117, active layer 118, p-type thin film barrier layer 119, p-type guide layer 120, p-type clad layer 121, p-type optical absorption layer 122, p-type contact layer 123-1, p-type optical guided mode control layer (layer of small refractive index) 124 and p-type contact layer 123-2 are sequentially grown and formed. The buffer layer 111 is formed of GaN, the n-type contact layers 112-1, 112-2 are formed of Si doped n-GaN, and the n-type optical guided mode control layer 113 is formed of Si doped n-InAlGaN. Further, the n-type optical absorption layer 114 is formed of Si doped n-InGaN, the n-type clad layer 115 is formed of Si doped n-AlGaN, the n-type guide layer 116 is formed of Si doped n-GaN and the n-type thin film barrier layer 117 is formed of Si doped n-AlGaN. The active layer 118 has a multiple quantum well (MQW) structure constructed by a periodic structure in which two types of InAlGaN layers having a thickness of 10 nm or less are alternately laminated. The p-type thin film barrier layer 119 is formed of Mg doped p-AlGaN, the p-type guide layer 120 is formed of Mg doped p-GaN, the p-type clad layer 121 is formed of Mg doped p-AlGaN, the p-type optical absorption layer 122 is formed of Mg doped p-InGaN, the p-type contact layers 123-1, 123-2 are formed of Mg doped GaN and the p-type optical guided mode control layer 124 is formed of Mg doped p-InAlGaN.

A portion ranging from the p-type contact layer 123-2 to the intermediate portion of the n-type contact layer 112-2 is partly etched, an n-side electrode (contact metallization) 126 is formed on the exposed surface of the n-type contact layer 112-2 and a p-side electrode (contact metallization) 125 is formed on the p-type contact layer 123-2.

In the optical absorption layers 122 and 114, it is preferable that the In composition thereof is higher than the In composition of the well layer of the active layer, but even if it is lower, the free carrier loss is increased to increase the absorption coefficient-by doping various types of metal impurities with high impurity concentration. As the optical guided mode control layer 113 or 124, a material having a large absorption coefficient like the optical absorption layers 114 and 122 is used or a material whose refractive index is made smaller than that of GaN by using AlGaN is used.

In FIG. 8, one layer of each of the optical guided mode control layers 113 and 124 is formed in each of the n-type contact layer 112 and p-type contact layer 123, but it is possible to form only one of them, or it is possible to provide two or more layers of the optical guided mode control layers 114, 122, and if the contact layer is formed with a super lattice structure of AlGaN and/or InGaN and GaN, for example, the same effect can be attained. If the contact layers 112, 123 are formed with the super lattice structure, it is possible to effect the modulation doping in order to reduce the resistance of series-connected resistors in the vertical direction of the layer. Further, it is possible to form only one of the optical absorption layers 114, 122 and the optical guided mode control layers 113, 124. For example, this includes a case wherein the optical absorption layer 114 and/or 122 is not formed and the optical guided mode control layer 113 is formed in the GaN contact layer 112.

As in this embodiment, if the optical absorption layers 114, 122 and/or optical guided mode control layers 113, 124 are formed, a large amount of light can be prevented from leaking into the contact layers 112, 123, the oscillation due to the high-order mode can be suppressed so as to cause FFP to exhibit a unimodal characteristic, and the threshold value can be reduced even in a state in which the thickness of the AlGaN clad layer is insufficient and light leaks into the contact layer 112, 123. If this embodiment is not used, it is understood that a large amount of light leaks into the p-type contact layer 123 and n-type contact layer 112 when viewing NFP. In this case, if the optical absorption layers 114, 122 and optical guided mode control layers 113, 124 are formed in the n-type contact layers 112, 123, the amount of light leaking into the n-type contact layers 112, 123 becomes smaller when viewing NFP and the oscillation threshold value is reduced.

In the conventional structure, FFP exhibits the multi-modal characteristic and the multi-modal characteristic is caused because light leaks into the p-GaN contact layer 123 and n-GaN contact layer 112 and the laser oscillation occurs in the high-order mode. However, as in this embodiment, if the optical absorption layers 114, 122 and optical guided mode control layers 113, 124 are formed in the contact layers 112, 123, FFP exhibits the unimodal characteristic.

It is necessary to take the measures for reducing the amount of light leaking into both of the p-type contact layer 123 and n-type contact layer as in this embodiment when a current is limited in the p side as in the current restricted structure, BH structure or SBR structure, for example, and it is particularly effective when the p-type contact layer is thick.

The semiconductor laser of this embodiment thus obtained continuously oscillates at room temperatures with the wavelength approximately equal to 420 nm, the threshold current density thereof is 1 kA/cm$^2$ or less and FFP exhibits the unimodal characteristic at the time of laser oscillation.

[Fourth Embodiment]

FIG. 9 is a cross sectional view showing the element structure of a semiconductor laser according to a fourth embodiment of this invention. In FIG. 9, portions which are the same as those of FIG. 1 are denoted by the same reference numerals and the detail explanation thereof is omitted.

On a sapphire substrate 110, a buffer layer 111, n-type contact layer 112-1, n-type optical guided mode control layer (layer of small refractive index) 113, n-type contact layer 112-2, n-type optical absorption layer 114, n-type clad layer 115, n-type guide layer 116, n-type thin film barrier layer 117, active layer 118, p-type thin film barrier layer 119, p-type guide layer 120, p-type clad layer 121, p-type optical absorption layer 122, current block layer 127-1, optical guided mode control layer (layer of small refractive index) 124-1 and current block layer 127-2 are sequentially grown and formed. The buffer layer 111 is formed of GaN, the n-type contact layers 112-1, 112-2 are formed of Si doped n-GaN, and the n-type optical guided mode control layer 113 is formed of Si doped n-InAlGaN. Further, the n-type optical absorption layer 114 is formed of Si doped n-InGaN, the n-type clad layer 115 is formed of Si doped n-AlGaN, the n-type guide layer 116 is formed of Si doped n-GaN and the n-type thin film barrier layer 117 is formed of Si doped n-AlGaN. The active layer 118 has a multiple quantum well (MQW) structure constructed by a periodic structure in which two types of InAlGaN layers having a thickness of 10 nm or less are alternately laminated. The p-type thin film barrier layer 119 is formed of Mg doped p-AlGaN, the p-type guide layer 120 is formed of Mg doped p-GaN, the p-type clad layer 121 is formed of Mg doped p-AlGaN and the p-type optical absorption layer 122 is formed of Mg doped p-InGaN. Further, the current block layers 127-1, 127-2 are formed of non-doped or Si doped n-InAlGaN and the optical guided mode control layer 124-1 is formed of non-doped or Mg doped p-InAlGaN.

The current block layer 127 having the optical guided mode control layer 124-1 formed therein is opened in a stripe form and the p-type contact layer 123-1 formed of Mg doped GaN, p-type optical guided mode control layer (layer of small refractive index) 124-2 and p-type contact layer 123-2 are grown and formed on the opening and current block layer 127. A portion ranging from the p-type contact layer 123-2 to the intermediate portion of the n-type contact layer 112-2 is partly etched, an n-side electrode (contact metallization) 126 is formed on the exposed surface of the n-type contact layer 112-2 and a p-side electrode (contact metallization) 125 is formed on the p-type contact layer 123-2.

In the optical absorption layers 122 and 114, it is preferable that the In composition thereof is higher than the In composition of the well layer of the MQW active layer, but even if it is lower, the free carrier loss is increased to increase the absorption coefficient by doping various types of metal impurities with high impurity concentration. As the optical guided mode control layer 113, 124-1 or 124-2, a material having a large absorption coefficient like the optical absorption layers 114 and 122 is used or a material whose refractive index is made smaller than that of GaN by use of AlGaN is used.

In FIG. 9, one layer of the optical guided mode control layer is formed in each of the n-type contact layer 112 and p-type contact layer 123, but it is possible to form only one of them, or it is possible to provide two or more optical guided mode control layers, and if the n-type contact layer and/or the current block layer is formed with a super lattice structure of AlGaN and/or InGaN and GaN, the same effect can be attained. If the contact layer is formed with the super lattice structure, it is possible to effect the modulation doping in order to reduce the resistance of series-connected resistors in the vertical direction of the layer. Further, it is possible to form only one of the optical absorption layers 114, 122 and the optical guided mode control layers 113, 124-2. For example, this includes a case wherein the optical absorption layer 114 and/or 122 is not formed and the optical guided mode control layers 113 and 124-2 are formed in the GaN contact layers 112 and 123.

As in this embodiment, if the optical absorption layers 114, 122 and/or the optical guided mode control layers 113, 124-1, 124-2 are formed in the block layer 127 and/or the contact layers 112, 123, a large amount of light can be prevented from leaking into the contact layers 112, 123, the oscillation due to the high-order mode can be suppressed so as to cause FFP to exhibit a unimodal characteristic, and the threshold value can be reduced even in a state in which the thickness of the AlGaN clad layer is insufficient and light leaks into the contact layers 112, 123. Further, if the optical absorption layers 114, 122 and optical guided mode control layers 113, 124-2 are formed in the n-type contact layers 112, 123, FFP exhibits the unimodal characteristic.

The semiconductor laser of this embodiment thus obtained continuously oscillates at room temperatures with the wavelength approximately equal to 420 nm, the threshold current density thereof is 1 kA/cm$^2$ or less and FFP exhibits the unimodal characteristic at the time of laser oscillation.

[Fifth Embodiment]

FIG. 10 is a cross sectional view showing the element structure of a semiconductor laser according to a fifth embodiment of this invention. In FIG. 10,, portions which are the same as those of FIG. 1 are denoted by the same reference numerals and the detail explanation thereof is omitted.

The semiconductor laser according to the fifth embodiment is similar to that of the fourth embodiment except that the current restricted operation is effected by means of a p-AlGaN clad layer 121. A current block layer 127 is formed of Si doped GaN, or preferably Si doped AlGaN or InGaN and an optical absorption layer 122 is formed in the clad layer 121. Further, an optical guided mode control layer 124 formed of InGaN or AlGaN is formed in the contact layer 123.

On the p side, by forming the optical absorption layer 122 and optical guided mode control layer 124 in the block layers 127-1, 127-2 and contact layer 123, the unimodal characteristic of FFP can be attained, the leakage of light into the contact layer 123 can be reduced and the threshold value can be reduced.

As in this embodiment, if the optical absorption layers 114, 122 and/or the optical guided mode control layers 113, 124 are formed, a large amount of light can be prevented from leaking into the contact layers 112, 123 or current block layer 127, the oscillation due to the high-order mode can be suppressed so as to cause the far field pattern (FFP) to exhibit a unimodal characteristic, and the threshold value can be reduced even in a state in which light leaks into the contact layers 112, 123 and current block layer 127-1, 127-2. Further, in the conventional structure, FFP exhibits the multi-modal characteristic and the multi-modal characteristic is caused because light leaks into the p-GaN contact layer 123 and n-GaN contact layer 112 and the laser oscillation occurs in the high-order mode. However, as in this embodiment, if the optical absorption layers 114, 122 and optical guided mode control layers 113, 124 are formed in the n-type contact layers 112, 123, FFP exhibits the unimodal characteristic.

The semiconductor laser of this embodiment thus obtained continuously oscillates at room temperatures with the wavelength approximately equal to 420 nm, the threshold current density thereof is 1 kA/cm$^2$ or less and FFP exhibits the unimodal characteristic at the time of laser oscillation.

This invention is not limited to the first to fifth embodiments described above. For example, the substrate is not limited to the sapphire substrate and Si, SiC, MgAl$_2$O$_4$, GaN can be used. Further, the optical absorption layer may be formed of a desired composition of GaInAlBN if the energy gap thereof with respect to oscillation light is small. Impurity doped into the optical absorption layer is not limited to Mg, Si, and any impurity which causes the absorption coefficient which is sufficiently large with respect to light from the active layer to be obtained can be used. The active layer may be of any one of i type, n type and p type. Further, the structure, film thickness and composition can be variously modified without departing from the technical scope of this invention.

[Sixth Embodiment]

Figure 11:
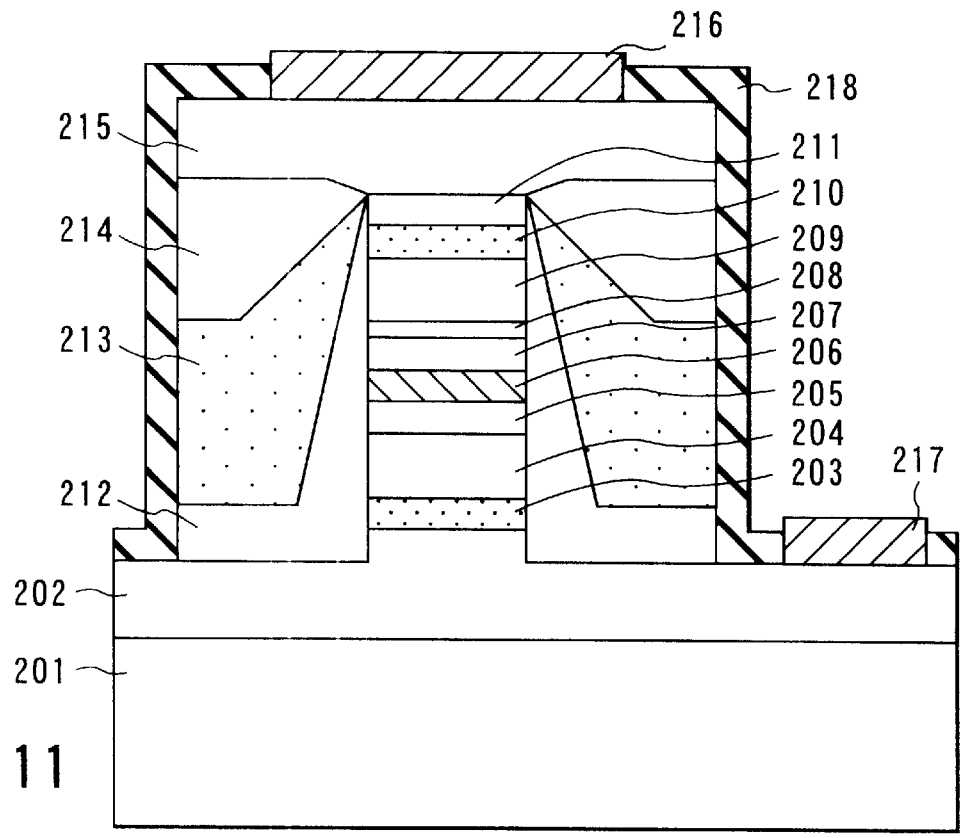
FIG. 11 is a cross sectional view showing the schematic structure of a blue semiconductor laser according to a sixth embodiment of this invention.

FIG. 11 is a cross sectional view showing the schematic structure of a blue semiconductor laser according to a sixth embodiment of this invention.

As shown in FIG. 11, on a sapphire substrate 201, an n-GaN contact layer (Si doped: 5×10$^{18}$ cm$^{-3}$, 3 μm) 202, n-In$_{0.2}$Ga$_{0.8}$N optical absorption layer (Si doped: 5×10$^{18}$ cm$^{-3}$, 0.1 μm) 203, n-Al$_{0.08}$Ga$_{0.92}$N clad layer (Si doped: 1×10$^{18}$ cm$^{-3}$, 0.8 μm) 204, n-GaN optical guided layer (Si doped: 1×10$^{18}$ cm$^{-3}$, 0.1 μm) 205, multiple quantum well (MQW) active layer 206 including an In$_{0.15}$Ga$_{0.85}$N well layer (3 nm, five layered) and In$_{0.02}$Ga$_{0.98}$N barrier layer (6 nm), p-Al$_{0.2}$Ga$_{0.8}$N carrier overflow preventing layer (20 nm) 207, p-GaN optical guided layer (Mg doped: 1×10$^{18}$ cm$^{-3}$, 0.1 μm) 208, p-Al$_{0.08}$Ga$_{0.92}$N clad layer (Mg doped: 1×10$^{18}$ cm$^{-3}$, 0.8 μm) 209, p-In$_{0.2}$Ga$_{0.8}$N optical absorption layer (Mg doped: 5×10$^{18}$ cm$^{-3}$, 0.1 μm) 210 and p-GaN contact layer (Mg doped: 2×10$^{18}$ cm$^{-3}$, 0.1 μm) 211 are sequentially grown and formed.

A portion ranging from the surface of the p-type contact layer 211 to the intermediate portion of the n-type contact layer 202 is removed with a mesa portion left behind in a stripe form, and a p-Al$_{0.08}$Ga$_{0.92}$N current block layer (Mg doped: 1×10$^{18}$ cm$^{-3}$, 0.1 μm) 212, n-In$_{0.2}$Ga$_{0.8}$N optical absorption layer (Si doped: 5×10$^{18}$ cm$^{-3}$, 0.3 μm) 213 and n-GaN current block layer (Si doped: 1×10$^{18}$ cm$^{-3}$, 2 μm) 214 are grown and formed on the side wall of the mesa portion left behind. A p-GaN contact layer (Mg doped: 2×10$^{18}$ cm$^{-3}$, 0.2 μm) 215 is grown and formed on the mesa portion and n-type current block layer 214.

A portion ranging from the surface of the p-type contact layer 215 to the p-type current block layer 212 is partly removed, an n-side electrode (contact metallization) 217 formed of Al/Ti/Au is formed on the exposed surface of the n-type contact layer 202, and a p-side electrode (contact metallization) 216 formed of Pt/Ti/Pt/Au is formed on the p-type contact layer 215. An SiO$_2$ insulating film 218 is formed to cover an exposed portion on which the electrodes 216, 217 are not formed. The width of the MQW active layer 206 is set to 4 μm. Further, although not shown in the drawing, a highly reflective coat formed of multiple laminated layers of TiO$_2$/SiO$_2$ is formed on the laser light emission end surface.

In this embodiment, in a case wherein the length of the resonator was 0.5 mm, the continuous oscillation at room temperatures was obtained with the threshold current 70 mA, oscillation wavelength 420 nm and operation voltage 5.2V. Further, the service life of the element was 5000 hours or more in the case of 50° C. and 5 mW driving. FFP exhibited the unimodal characteristic with the horizontal angle 7° and vertical angle 22°, and the astigmatic difference was small and 5 μm and a beam characteristic suitable for application to the optical disk could be attained.

In the case of the laser of this embodiment, since the GaN layer which is transparent with respect to the oscillation light is formed on the exterior of the AlGaN clad layers 204 and 209 holding the MQW active layer 206 therebetween, the transverse mode is an anti-index guided mode, but the attenuation in the high-order vertical transverse mode becomes large with respect to light leaking into the exterior of the AlGaN clad layers 204 and 209 by means of the InGaN optical absorption layers 203 and 210. Further, the anti-index guided structure is obtained in the horizontal direction of the active layer, but since the loss becomes larger in the high-order horizontal transverse mode of the n-In$_{0.2}$Ga$_{0.8}$N optical absorption layer 213 than in the fundamental mode or it may be cut off, the wave front in the resonator can be made perpendicular to the resonator direction, the spread angle of FFP can be suppressed and the astigmatic difference can be made small even if the width of the active layer is not narrowed to a value approximately equal to the wavelength. Therefore, in the manufacturing process, since the operation for controlling the width of the active layer which is as small as approx. 0.4 μm of the oscillation wavelength is not necessary, a semiconductor laser suitable for the optical disk system with high recording density can be easily obtained with high yield.

Further, if the n-In$_{0.2}$Ga$_{0.8}$N optical absorption layer 203 and p-In$_{0.2}$Ga$_{0.8}$N optical absorption layer 210 are respectively replaced by an optical absorption layer of quantum well structure including an n-In$_{0.25}$Ga$_{0.75}$N (Si doped: 5×10$^{18}$ cm$^{-3}$, 3 nm, 10 layers) well layer and n-In$_{0.02}$Ga$_{0.98}$N (Si doped: 5×10$^{18}$ cm$^{-3}$, 6 nm) barrier layer and an optical absorption layer of quantum well structure including a p-In$_{0.25}$Ga$_{0.75}$N (Mg doped: 5×10$^{18}$ cm$^{-3}$, 3 nm, 10 layers) well layer and p-In$_{0.02}$Ga$_{0.98}$N (Mg doped: 5×10$^{18}$ cm$^{-3}$, 6 nm) barrier layer, then the improvement can be obtained such that FFP exhibits the unimodal characteristic with the horizontal angle 7° and vertical angle 20° and the astigmatic difference is small and 3 μm. This is because suppression of the vertical transverse mode in the optical absorption layer can be improved in comparison with the case of a single layer. Further, a fluctuation in the elements in the wafer surface can be made small and the yield can be enhanced. This is because the internal distortion becomes large if the optical absorption layer having a high In composition is made thicker in the form of single layer but the flatness and suppression of distortion can be attained by forming the quantum well structure.

[Seventh Embodiment]

Figure 12:
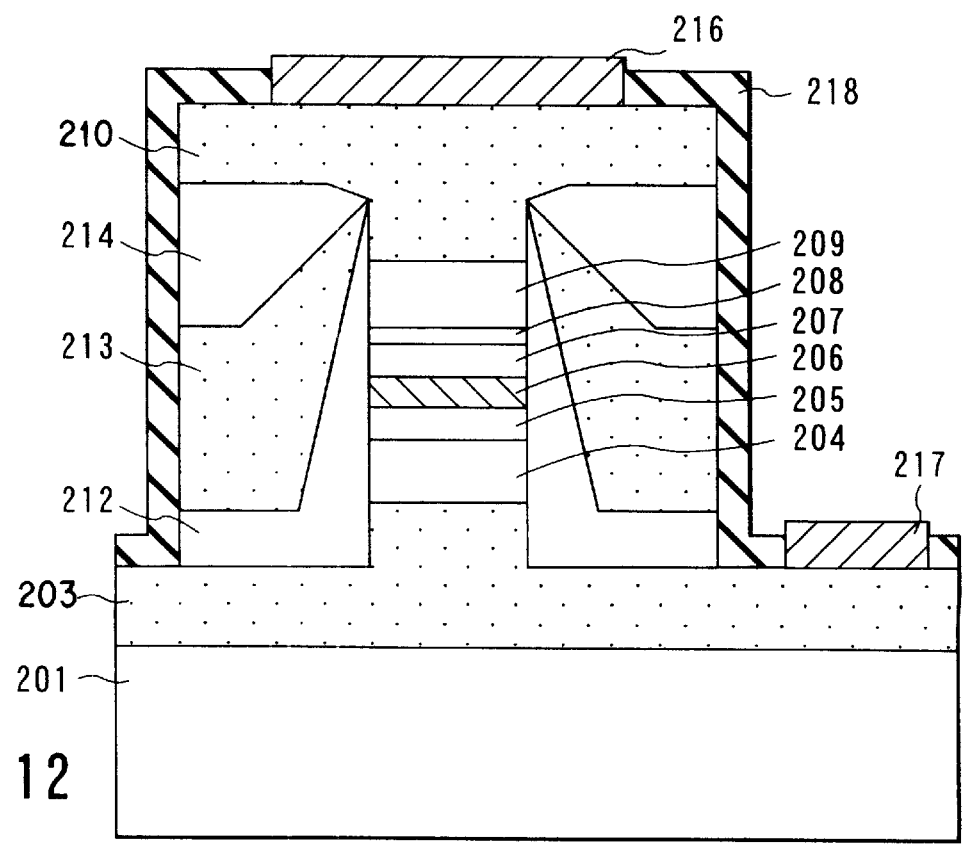
FIG. 12 is a cross sectional view showing the schematic structure of a blue semiconductor laser according to a seventh embodiment of this invention.

FIG. 12 is a cross sectional view showing the schematic structure of a blue semiconductor laser according to a seventh embodiment of this invention. In FIG. 12, portions which are the same as those of FIG. 11 are denoted by the same reference numerals and the detail explanation thereof is omitted.

The embodiment of FIG. 12 is similar to the sixth embodiment except that the n-GaN contact layer 202 is replaced by the n-$In_{0.2}Ga_{0.8}N$ optical absorption layer 203 and the p-GaN contact layers 211 and 215 are replaced by the p-$In_{0.2}Ga_{0.8}N$ optical absorption layer 210. Thus, the n-$In_{0.2}Ga_{0.8}N$ optical absorption layer 203 and p-$In_{0.2}Ga_{0.8}N$ optical absorption layer 210 function as an optical absorption layer and an electrode contact layer.

In this embodiment, in a case wherein the length of the resonator is 0.5 mm, the continuous oscillation at room temperatures was obtained with the threshold current 75 mA, oscillation wavelength 420 nm and operation voltage 4.8V. Further, the service life of the element was 5000 hours in the case of 50° C., and 5 mW driving. Further, FFP exhibited the unimodal characteristic with the horizontal angle 5° and vertical angle 20°, and the astigmatic difference was as small as 4 μm and a beam characteristic suitable for application to the optical disk could be attained.

In the case of the laser of this embodiment, since only the n-GaN current block layer 214 is provided on the exterior of the AlGaN clad layers 204 and 209 holding the MQW active layer 206 therebetween as the GaN layer which is transparent with respect to the oscillation light, the transverse mode is an anti-index guided mode as in the sixth embodiment, but since the high-order vertical transverse mode can be completely attenuated by means of the InGaN optical absorption layer, and therefore, the spread angle of FFP can be suppressed and the astigmatic difference can be made small in comparison with the sixth embodiment. Further, since the InGaN optical absorption layers 203 and 210 are also used as the electrode contact layer, the contact resistances on the p side and n side are lowered, thereby making it possible to lower the operation voltage.

This invention is not limited to the sixth and seventh embodiments and, for example, the substrate is not limited to the sapphire substrate and Si,.SiC, $MgAl_2O_4$, GaN can be used. Further, the optical absorption layer may be formed of a desired composition of GaInAlBN if the energy gap thereof with respect to oscillation light is small. Impurity doped into the optical absorption layer is not limited to Mg, Si, and any impurity can be used irrespective of the conductivity type if the absorption coefficient of approx. $10^5$ $cm^{-1}$ is obtained. Further, the structure, film thickness and composition can be variously modified without departing from the technical scope of this invention.

[Eighth Embodiment]

Figure 13:
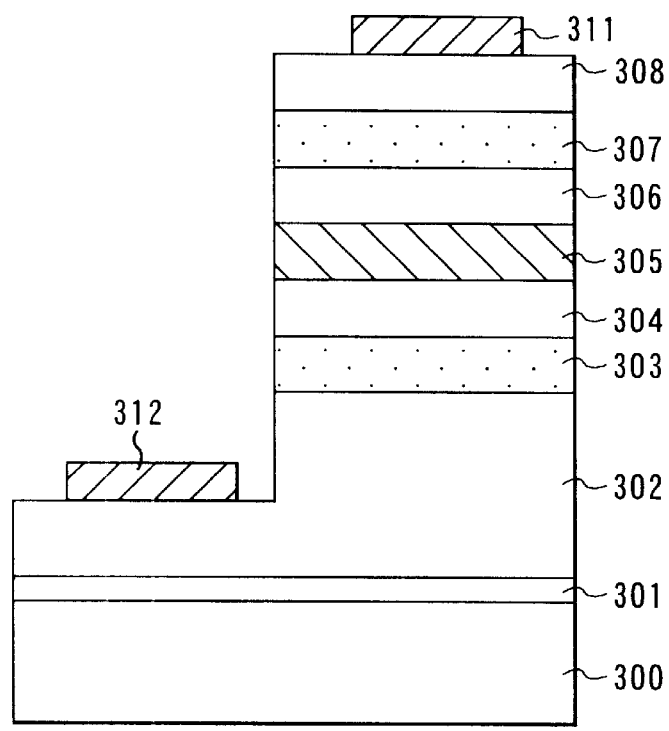
FIG. 13 is a cross sectional view showing the schematic structure of a blue semiconductor laser according to an eighth embodiment of this invention.

FIG. 13 is a cross sectional view showing the schematic structure of a blue semiconductor laser according to an eighth embodiment of this invention.

As shown in FIG. 13, on a sapphire substrate 300, an AlN/InN super lattice buffer layer (undoped, 4 μm, the thickness ratio of AlN:InN=8:2) 301, n-$In_{0.1}Ga_{0.9}N$ contact layer (Si doped: 3 to $5\times10^{18}$ $cm^{-3}$, 4 μm) 302, n-GaN/$Ga_{0.85}As_{0.15}N$ super lattice optical absorption layer (Si doped: 3 to $5\times10^{18}$ $cm^{-3}$, 0.1 μm, the thickness ratio of GaN:GaAsN=8:2) 303, n-$Al_{0.3}Ga_{0.7}N$ clad layer (Si doped: $5\times10^{17}$ $cm^{-3}$, 0.3 μm) 304, $In_{0.2}Ga_{0.8}N$ active layer (undoped, 0.1 μm) 305, p-$Al_{0.3}Ga_{0.7}N$ clad layer (Mg doped: $5\times10^{17}$ $cm^{-3}$, 0.3 μm) 306, p-GaN/$Ga_{0.85}As_{0.15}N$ super lattice optical absorption layer (Mg doped: 1 to $3\times10^{18}$ $cm^{-3}$, 0.1 μm, the thickness ratio of GaN GaAsN=8:2) 307 and p-$In_{0.1}Ga_{0.9}N$ contact layer (Mg doped: 1 to $3\times10^{18}$ $cm^{-3}$, 0.1 μm) 308 are sequentially grown and formed. The crystal growth of the layers 302 to 308 are made by the MOCVD method (Metal Organic Chemical Vapor Deposition method).

After the growth of the layers 302 to 308, a mask is formed on a portion which will be used as a p-side electrode, a portion other than the above portion is etched until the n-type contact layer 302 is reached, and then an $SiO_2$ film for preventing a leak current is formed on the entire surface. The $SiO_2$ film on portions on which p-side and n-side electrodes are formed is removed and p-side and n-side electrode metal films 311, 312 are vapor deposited.

The n-GaN/$Ga_{0.85}As_{0.15}N$ super lattice optical absorption layers 303, 307 are lattice matched with the AlN/InN super lattice buffer layer 301 on both of the p side and n side and contain InN having a bandgap smaller than the energy of light emitted from the active layer 305, and light is abruptly attenuated in this layer and the optical confinement mode can be easily attained at the time of laser oscillation.

In the case of the laser of this embodiment, the continuous oscillation at room temperatures was obtained with the threshold current 80 mA. At this time, the oscillation wavelength was 420 nm and the operation voltage was 4V. The oscillation threshold current was lowered to 80 mA which was lower than 100 mA of the conventional element which did not use the current restricted structure. Further, the far field pattern exhibited two peaks in the conventional case as shown in FIG. 16A, but in this embodiment, it exhibited one peak as shown in FIG. 16B and the half width in the vertical direction became 14° which was practically satisfactory for the pickup of the optical disk.

In this embodiment, as the crystal growth method, the MOCVD method is used, but an MBE method can be used.

[Ninth Embodiment]

Figure 14:
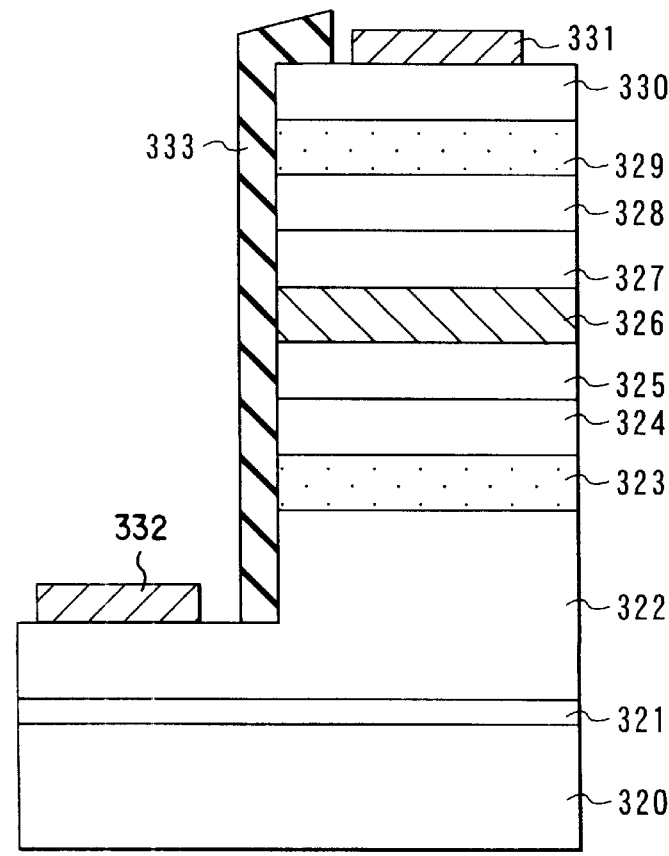
FIG. 14 is a cross sectional view showing the schematic structure of a blue semiconductor laser according to a ninth embodiment of this invention.

FIG. 14 is a cross sectional view showing the schematic structure of a blue semiconductor laser according to a ninth embodiment of this invention.

On a sapphire substrate 320, an AlN buffer layer (undoped, 10 nm) 321, n-$In_{0.1}Ga_{0.9}N$ contact layer (Si doped: $1\times10^{19}$ $cm^{-3}$, 3 μm) 322, n-$Ga_{0.97}As_{0.03}N$ optical absorption layer (Si doped: 3 to $5\times10^{18}$ $cm^{-3}$, 0.1 μm) 323, n-$Al_{0.1}Ga_{0.9}N$ clad layer (Si doped: $5\times10^{17}$ $cm^{-3}$, 0.8 μm) 324, GaN optical confinement layer (Si doped: 0.1 μm) 325, $In_{0.1}Ga_{0.0}N$ active layer (Si doped, 10 nm) 326, GaN optical confinement layer (undoped, 0.1 μm) 327, p-$Al_{0.1}Ga_{0.9}N$ clad layer (Mg doped: $5\times10^{17}$ $cm^{-3}$, 0.8 μm) 328, p-$Ga_{0.97}As_{0.03}N$ optical absorption layer (Mg doped: 1 to $3\times10^{18}$ $cm^{-3}$, 0.1 μm) 329 and p-$In_{0.1}Ga_{0.9}N$ contact layer (Mg doped: 1 to $3\times10^{18}$ $cm^{-3}$, 0.3 μm) 330 are sequentially grown and formed. The crystal growth method for forming the above layers is effected by the MBE method.

A portion ranging from the surface of the p-type contact layer 330 to the n-type contact layer 322 is partly removed by etching, an n-side electrode 332 is formed on the n-type contact layer 322 which is partly removed, and a p-side electrode 331 is formed on the p-type contact layer 330. On the surface of a portion other than the electrode forming portion, an $SiO_2$ insulating film 333 for preventing a leak current is formed.

The lattice constants of the $Ga_{0.97}As_{0.03}N$ optical absorption layers 323, 329 are lattice matched with that of $In_{0.1}Ga_{0.9}N$ on both of the p side and n side and have a bandgap smaller than the energy of light emitted from the active layer 326.

In the case of the element of this embodiment, the continuous oscillation was obtained up to 80° C. with the threshold current 80 mA. At this time, the oscillation wavelength was 375 nm and the operation voltage was 4V. With this element, since the leakage amount of light was reduced by the super lattice optical absorption layer and the light density in the light emission layer became high, the threshold value was lowered, the far field pattern exhibited the unimodal characteristic, no phase shift of light occurred, and light emission suitable for both of reading and writing of the optical recording disk could be attained. Further, dislocation which might occur during or after growth could be reduced by use of the super lattice.

[Tenth Embodiment]

FIG. 15 is a cross sectional view showing the schematic structure of a blue semiconductor laser according to a tenth embodiment of this invention.

On a sapphire substrate 340, an n-GaN buffer layer (undoped, 0.1 μm) 341, $n\text{-}Ga_{0.9}Al_{0.1}Sb_{0.1}N_{0.9}$ contact optical absorption layer (Si doped: 3 to $5\times10^{18}$ cm$^{-3}$, 4 μm) 342, n-AlGaN clad layer (Si doped: $5\times10^{17}$ cm$^{-3}$, 0.3 μm) 343, n-GaN optical guide layer (Si doped: $5\times10^{17}$ cm$^{-3}$, 0.1 μm) 344, $In_{0.3}Ga_{0.7}N$/GaN multiple quantum well active layer (undoped, well width: 2 nm, barrier width 4 nm, the number of pairs: 3) 345, p-GaN optical guide layer (Mg doped: $5\times10^{17}$ cm$^{-3}$, 0.1 μm) 346, p-AlGaN clad layer (Mg doped: $5\times10^{17}$ cm$^{-3}$, 0.3 μm) 347, $p\text{-}Ga_{0.9}Al_{0.1}Sb_{0.1}N_{0.9}$dcontact optical absorption layer (Mg doped: 1 to $3\times10^{18}$ cm$^{-3}$, 0.5 μm) 348, n-GaN conduction barrier layer (Si doped: $1\times10^{18}$ cm$^{-3}$, 0.3 μm) 349 and p-GaN contact layer 350 are sequentially formed in a laminated form. A p-side electrode 351 is formed on the contact layer 350. An n-side electrode 352 is formed on the exposed surface of the contact optical absorption layer 342 formed by partly etching a portion ranging from the contact layer 350 to the intermediate portion:of the contact optical absorption layer 342.

The manufacturing process is effected as follows. That is, the above layers up to the n-GaN conduction barrier layer 349 are first grown by the MOCVD method, then a mask is formed in the stripe form on part of the conduction barrier layer 309 by photolithography and the conduction barrier layer 309 is partly etched until the p-GaAlSbN optical absorption layer 348 is exposed. Next, the p-GaN contact layer 350 is grown. Like the former embodiment, a portion reaching the n-type contact layer 342 is removed, the n-side electrode 352 is formed on the exposed surface of the n-type contact layer 342 and the p-side electrode 351 is formed on the p-type contact layer 350, thereby completing a blue semiconductor laser with the structure shown in FIG. 15.

The laser of this embodiment continuously oscillated at room temperatures with the threshold current of 20 mA. At this time, the oscillation wavelength was 420 nm and the operation voltage was 3.8V.

[Eleventh Embodiment]

Figure 17:
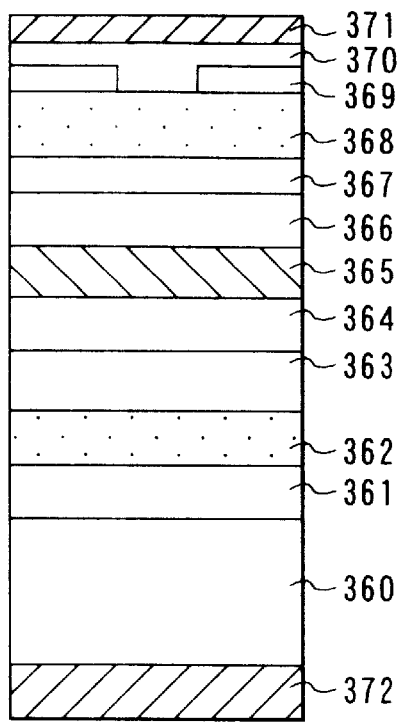
FIG. 17 is a cross sectional view showing the schematic structure of a blue semiconductor laser according to an eleventh embodiment of this invention.

FIG. 17 is a cross sectional view showing the schematic structure of a blue semiconductor laser according to an eleventh embodiment of this invention.

As shown in FIG. 17, on a p-SiC substrate 360, a p-AlN/InN buffer layer (Mg doped: 3 to $5\times10^{20}$ cm$^{-3}$, 1 μm, the thickness ratio AlN:InN=0.7:0.3) 361, p-GaN/$Ga_{0.9}P_{0.1}N$ super lattice optical absorption layer (Mg doped: $1\times10^{19}$ cm$^{-3}$, 0.4 μm, the thickness ratio GaN:GaPN=0.7:0.3) 362, $p\text{-}Al_{0.3}Ga_{0.7}N$ clad layer (Mg doped: $5\times10^{17}$ cm$^{-3}$, 0.3 μm) 363, $Al_{0.1}Ga_{0.9}N$ optical guide layer (undoped, 0.01 μm) 364, $In_{0.1}Ga_{0.9}N$/$Al_{0.1}Ga_{0.9}N$ multiple quantum well active layer (undoped, well thickness: 2 nm, barrier thickness: 4 nm, the number of pairs: 3) 365, $Al_{0.1}Ga_{0.9}N$ optical guide layer (undoped, 0.01 μm) 366, $n\text{-}Al_{0.3}Ga_{0.7}N$ clad layer (Si doped: $5\times10^{17}$ cm$^{-3}$, 0.3 μm) 367, n-GaN/$Ga_{0.9}P_{0.1}N$ super lattice optical absorption layer (Si doped: $1\times10^{19}$ cm$^{-3}$, 0.4 μm, the thickness ratio GaN:GaPN=0.7:0.3) 368, p-GaN current restricted layer (Mg doped: $5\times10^{17}$ cm$^{-3}$, 0.1 μm) 369 and n-GaN contact layer (Si doped: 1 to $3\times10^{19}$ cm$^{-3}$, 0.1 μm) 370 are sequentially laminated. An n-side electrode 371 is formed on the contact layer 370 and a p-side electrode 372 is formed on the rear surface of the p-SiC substrate 360.

The manufacturing process is effected as follows. That is, the above layers up to the p-GaN current restricted layer 369 are first formed by the MOCVD method, then a mask is formed in the stripe form on part of the current restricted layer 369 by photolithography and the current restricted layer 369 is etched until the n-GaN/GaPN super lattice optical absorption layer 368 is exposed. Next, the p-GaN contact layer 370 is grown. Further, the electrodes 371, 372 are formed on both sides of the resultant semiconductor structure and the end face of the resonator is formed by cleavage.

With the element of the above structure of this embodiment, it was confirmed that the element oscillated in the fundamental transverse mode with the threshold current 70 mA and the oscillation wavelength 375 nm and the stable operation was obtained at least for 5000 hours.

In this embodiment, the current restricted layer is formed in opposition to the substrate with respect to the active layer, but the current restricted layer may be formed on the substrate side or on both sides. Further, a material having a smaller refractive index than the contact layer is used for the current restricted layer, but a material having a larger refractive index may be used.

[Twelfth Embodiment]

Figure 18:
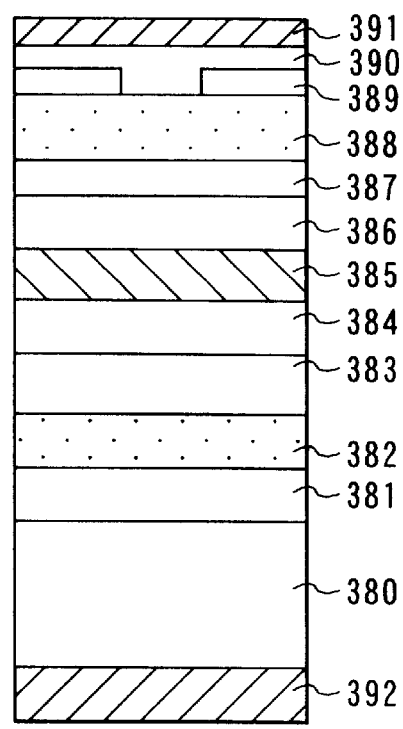
FIG. 18 is a cross sectional view showing the schematic structure of a blue semiconductor laser according to a twelfth embodiment of this invention.

FIG. 18 is a cross sectional view showing the schematic structure of a blue semiconductor laser according to a twelfth embodiment of this invention.

As shown in FIG. 18, on a p-SiC substrate 380, a p-GaN buffer layer (Mg doped: 3 to $5\times10^{20}$ cm$^{-3}$, 3 μm) 381, p-GaN optical absorption layer (Mg doped: $1\times10^{19}$ cm$^{-3}$, 0.1 μm) 382, $p\text{-}Al_{0.4}Ga_{0.6}N$ clad layer (Mg doped: $5\times10^{17}$ cm$^{-3}$, 0.3 μm) 383, $Al_{0.3}Ga_{0.7}N$ optical guide layer (undoped, 0.1 μm) 384, $Al_{0.1}Ga_{0.9}N$/$Al_{0.2}Ga_{0.8}N$ multiple quantum well active layer (undoped, well thickness: 2 nm, barrier thickness: 4 nm, the number of pairs: 3) 385, $Al_{0.1}Ga_{0.9}$optical guide layer (undoped, 0.1 μm) 386, $n\text{-}Al_{0.4}Ga_{0.6}N$ clad layer (Si doped: $5\times10^{17}$ cm$^{-3}$, 0.3 μm) 387, n-GaN optical absorption layer (Si doped: 1 to $3\times10^{19}$ cm$^{-3}$, 0.1 μm) 388, p-GaN current restricted layer (Mg doped: $5\times10^{17}$ cm$^{-3}$, 0.1 μm) 389 and n-GaN contact layer (Si doped: 1 to $3\times10^{19}$ cm$^{-3}$, 0.1 μm) 390 are sequentially formed in a laminated form. An n-side electrode 391 is formed on the contact layer 390 and a p-side electrode 392 is formed on the rear surface of the p-SiC substrate 380.

The manufacturing process is effected as follows. That is, the above layers up to the p-GaN current restricted layer 389 are first formed by the MOCVD method, then a mask is formed in the stripe form on part of the current restricted layer 389 by photolithography and the current restricted layer 389 is etched until the n-GaN optical absorption layer 388 is exposed. Next, the p-GaN contact layer 390 is grown. Further, the electrodes 391, 392 are formed on both sides of the resultant semiconductor structure and the end face of the resonator is formed by cleavage.

With the element of the above structure of this embodiment, it was confirmed that the element oscillated in the fundamental transverse mode with the threshold current 70 mA and the oscillation wavelength 375 nm and the stable operation was obtained at least for 5000 hours.

Figure 19:
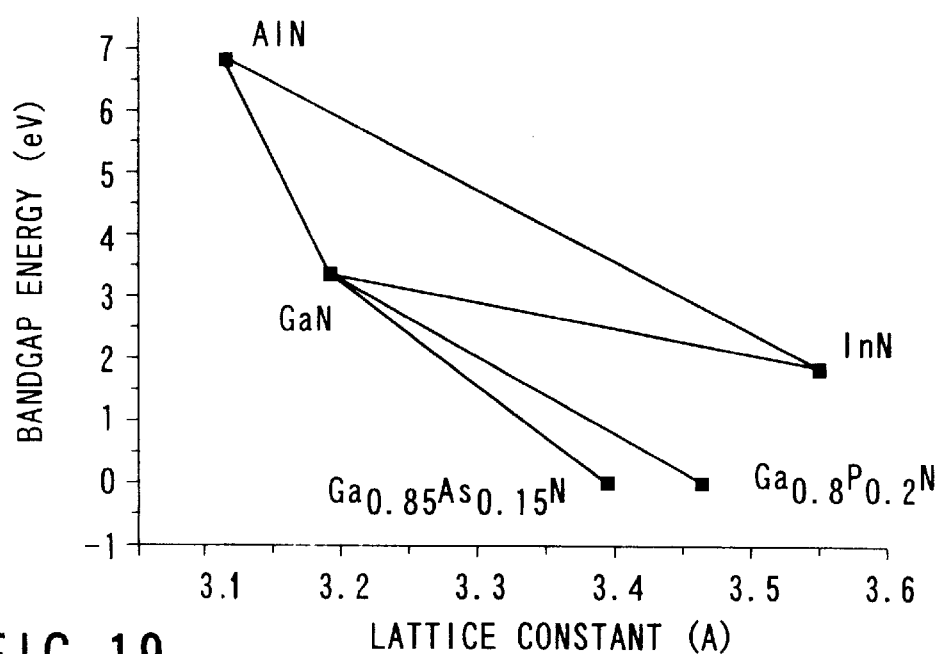
FIG. 19 is a diagram showing the relation between the lattice constant and the bandgap energy.
Figure 20:
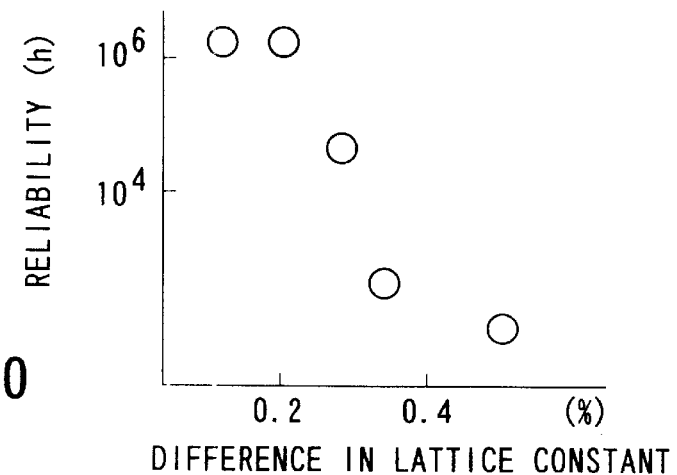
FIG. 20 is a diagram showing the relation between the difference in the lattice constant and the reliability.

In the eighth to twelfth embodiments, the sapphire substrate or SiC substrate is used as the underlying substrate, a ZnO substrate or spinel substrate may be used. Further, since portions other than the substrate portion of the element are formed so as to be lattice matched, the element can be formed in a combination other than the combinations described in the above embodiments by determining the compositions of the respective layers of the element according to the lattice constant of the crystal lattice of the thickest portion among the element other than the substrate. As shown in FIG. 19, the absorption layer, light emitting layer and clad layer may be formed in this order from a point at which the lattice constants on the abscissa are equal in the upward direction on the drawing so as to have the same lattice constant. At this time, if the light emitting layer is thin, it is not necessary to lattice match the layer and a better element can be formed from the viewpoint of the threshold value if the layer is not lattice matched to such a degree that the distortion is not reduced. In any one of the above embodiments, the reliability was significantly enhanced as shown in FIG. 20 if a difference in the lattice constant was within 0.2%. Further, when the super lattice was used, the reliability was further enhanced by a reduction in dislocation.

[Thirteenth Embodiment]

Figure 21:
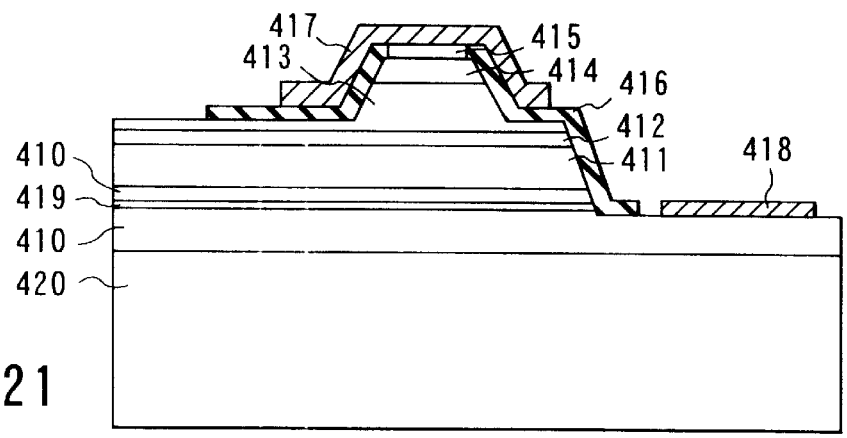
FIG. 21 is a cross sectional view showing the schematic structure of a blue semiconductor laser according to a thirteenth embodiment of this invention.

FIG. 21 is a cross sectional view showing the schematic structure of a blue semiconductor laser according to a thirteenth embodiment of this invention.

All of the nitride layers were grown by use of the MOCVD method. The condition for growth was set such that the pressure was set at a normal pressure, the GaN and AlGaN layers other than the buffer layer were basically grown in the temperature range of 1000° C. to 1100° C. in an atmosphere containing nitrogen, hydrogen and ammonium and the active layer was grown in the temperature range of 700° C. to 850° C. in an atmosphere containing nitrogen and ammonium.

The sapphire substrate 420 is formed with (0001)c surface and the laser mirror is formed by cleavage. On the sapphire substrate 420, an n-GaN contact layer (Si doped: $1 \times 10^{18}$ cm$^{-3}$) 410 is formed. An optical absorption layer 419 is formed in the contact layer 410. An n-$Al_{0.08}Ga_{0.92}N$ clad layer (Si doped: $1 \times 10^{18}$ cm$^{-3}$, 0.6 $\mu$m) 411 is formed on the contact layer 410 and an active layer portion 412 is formed on the clad layer 411. The active layer portion 412 includes a multiple quantum well structure (MQW), Al cap layer and optical guide layer and has optical guide layers of GaN with a thickness of 0.1 $\mu$m formed on both sides thereof, the well layer is formed of an $In_{0.15}Ga_{0.85}N$ layer of 3 nm thickness and the barrier layer is formed of an $In_{0.02}Ga_{0.98}N$ layer with a thickness of 6 nm. The well layer has a five-layered structure. A p-$Al_{0.20}Ga_{0.80}N$ thin film barrier layer with a thickness of 2 nm is inserted between the MQW layer and guide layer on the p side.

On the active layer portion 412, a p-$Al_{0.08}Ga_{0.92}N$ clad layer (Mg doped: $5 \times 10^{19}$ cm$^{-3}$, 0.6 $\mu$m) 413 and p-GaN contact layer (Mg doped: $8 \times 10^{19}$ cm$^{-3}$, 0.2 $\mu$m) 414 are formed and the top portion of the p-GaN contact layer 414 is doped with Mg with high impurity concentration of $2 \times 10^{20}$ cm$^{-3}$. A p-side electrode 415 formed of Pt/Ti/Pt/Au is formed on the contact layer 414 and the exposed surfaces of a region of the contact layer 410 except the electrode forming region, optical absorption layer 419, clad layer 411, active layer portion 412, clad layer 413 and contact layer 414 are covered with an $SiO_2$ dielectric film 416. A pad electrode 417 formed of Cr/Au is formed on the p-side electrode 415 and dielectric film 416 and an n-side electrode 418 is formed on the exposed surface of the contact layer 410.

The optical absorption layer 419 is the main portion of this embodiment and has a multiple quantum well (MQW) structure. The well layer is formed of an $In_{0.20}Ga_{0.80}N$ layer with a thickness of 3 nm and the barrier layer is formed of a GaN layer with a thickness of 6 nm. The well layer is formed with a ten-layered structure. The composition of the well layer of the MQW structure portion was set to be larger than the composition of the well layer of the active layer by 5% so as to cause a loss with respect to light of the oscillation wavelength. If it was formed of a single layered InGaN layer instead of MQW, the entire surface of the wafer was blackened, but the blackening disappeared and a good morphology was obtained by adjusting the average In composition of MQW to 8% or less with a GaN layer used as the barrier layer. The distance to the inserting position of the MQW layer was set to 0.9 $\mu$m which was approximately equal to the distance from the active layer to the p-side electrode.

The structure of this embodiment is formed as follows. First, after the layers up to the p-type contact layer 414 are sequentially grown in the crystal form on the sapphire substrate 420, a ridge structure as shown in FIG. 21 is formed by use of the photolithography technology using a photosensitive resist and the dry-etching technique using reactive chlorine series ion. Then, after a dielectric ($SiO_2$) film is formed on the entire surface, the photolithography technology and chemical etching technique are repeatedly used to form an opening near the ridge and the p-side electrode 415 is formed. The ridge width is 4 $\mu$m on the bottom surface and the opening width of the $SiO_2$ film is 3 $\mu$m. The metal film lying beside the ridge provides a difference in the effective refractive index in a direction parallel to the bonding surface and stabilizes the horizontal transverse mode.

In this embodiment, the continuous oscillation was obtained at room temperatures with the threshold current of 65 mA. At this time, the oscillation wavelength was 405 nm and the operation voltage was 5.5V. The beam characteristic was a unimodal characteristic and the astigmatic difference was 10 was sufficiently small. The largest optical power was 10 mW with the continuous oscillation, the highest continuous oscillation temperature was 60° C. and the high reliability was obtained such that the stable operation was obtained at room temperatures for 1000 hours or more. The above characteristics were obtained by use of the structure having the substrate side bonded to a heat sink. The substrate was thinned to 50 $\mu$m by polishing. In the conventional ridge structure, the threshold current was as large as 100 mA, the highest continuous oscillation temperature was low and 30° C., and all of the beam characteristics were a bimodal characteristic.

Figure 22:
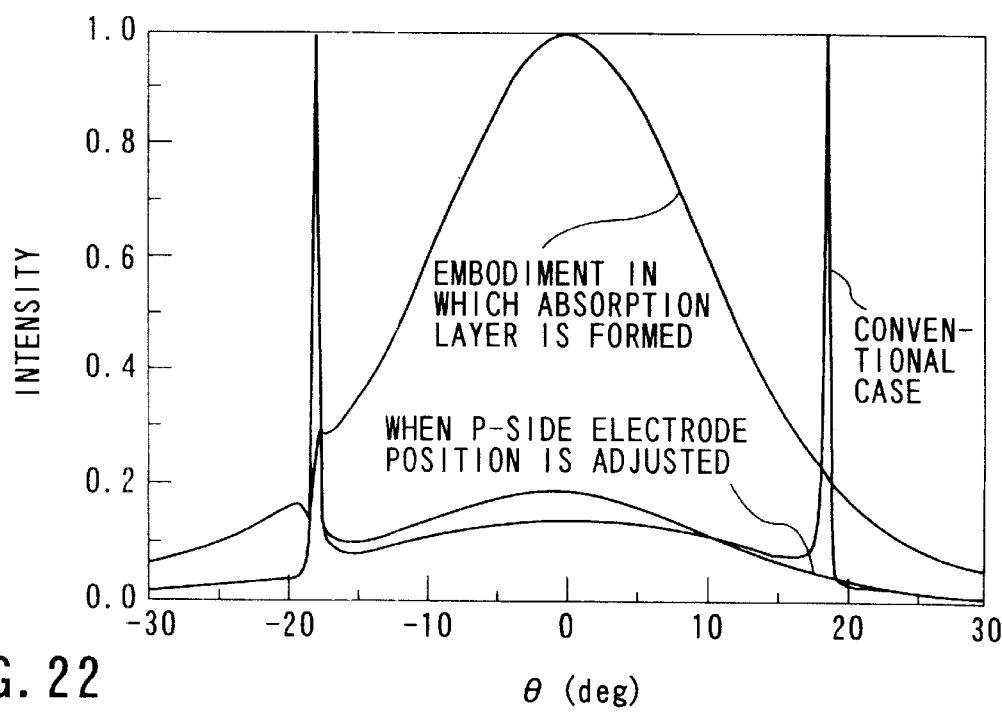
FIG. 22 is a diagram for illustrating the principle of the thirteenth embodiment of this invention.

FIG. 22 is a diagram for illustrating the, principle of this embodiment. The abscissa indicates the solid angle from the emitting portion and the ordinate indicates the relative light intensity, and the beam characteristic called a far field pattern (FFP) is shown. The result is derived by calculations. In the conventional structure which does not have the optical absorption layer 419, steep bimodal peaks occur. This is because a phenomenon that light leaking from the active layer is guided into the outside contact layer or the like or a so-called anti-index guided mode phenomenon occurs. On the other hand, the amount of light guided and leaked into the contact layer 414 on the p-side electrode side is suppressed by setting the p-side electrode 415 in a position relatively near the active layer portion 412 (approx. 0.9 μm as in the embodiment of FIG. 21) and a unimodal peak can be obtained as shown in FIG. 22 by inserting the optical absorption layer 419 with a thickness of 10 nm or more having an absorption coefficient of approx. $10^5$ $cm^{-1}$ on the n-side electrode side.

It is preferable that the position of the optical absorption layer 419 is set such that the distance between the optical absorption layer and the active layer is approximately equal to the distance between the metal electrode and the active layer by taking the refractive index with respect to the oscillation light into consideration from the viewpoint of the symmetry of the beam characteristic and the tolerance of the solution of convergence of the fundamental mode.

Various parameters may be considered as the parameter of MQW, but it is preferable to increase the In composition of the well layer and reduce the In composition of the barrier layer by making the optical absorption sufficiently large as described in this embodiment and taking the growth temperatures of all of the layer structures into consideration. For example, it is possible to set the In compositions of the well layer and barrier layer equal to that of the MQW portion of the active layer and adjust the thickness thereof to satisfy the above condition.

[Fourteenth Embodiment]

Figure 23:
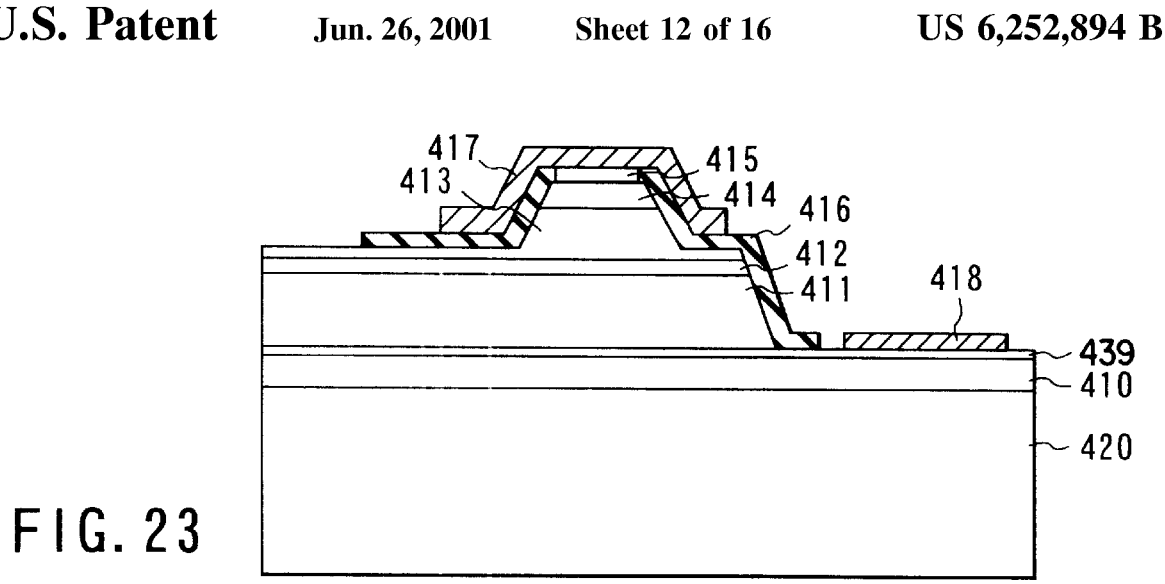
FIG. 23 is a cross sectional view showing the schematic structure of a blue semiconductor laser according to a fourteenth embodiment of this invention.

FIG. 23 is a cross sectional view showing the schematic structure of a blue semiconductor laser according to a fourteenth embodiment of this invention. In FIG. 23, portions which are the same as those of FIG. 21 are denoted by the same reference numerals and the detail explanation thereof is omitted.

The basic structure is similar to that of the thirteenth embodiment and is different from the thirteenth embodiment in the structure and arrangement of an optical absorption layer 439. That is, the optical absorption layer 439 is formed with the MQW structure, the well layer is formed of an $In_{0.20}Ga_{0.80}N$ layer, the barrier layer is formed of a GaN layer with a thickness of 6 nm. The well layer is formed with a 20-layered structure. In this embodiment, since the optical absorption layer 439 is exposed in the contact portion of the n-side electrode 418 so that an electrode contact can be formed in contact with the optical absorption layer 439. Therefore, since a contact can be formed on a layer with smaller bandgap, the operation voltage can be lowered.

The threshold current at the room temperature was the same as that in the thirteenth embodiment, but since the n-side contact resistance was made low and the operation voltage was lowered to 4.5V, the highest continuous oscillation temperature could be enhanced from 60° C. to 80° C. Further, the reliability test could be made at high temperatures and it was confirmed that the stable operation was effected for 1000 hours or more at 50° C.

[Fifteenth Embodiment]

Figure 24:
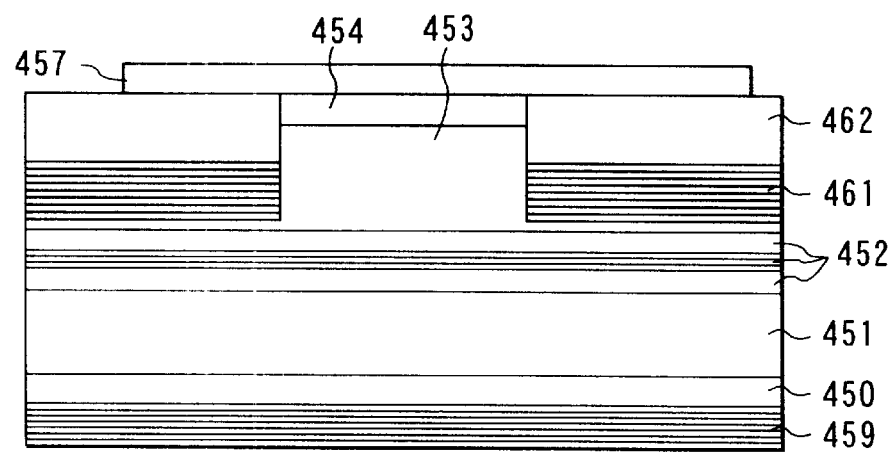
FIG. 24 is a cross sectional view showing the schematic structure of a blue semiconductor laser according to a fifteenth embodiment of this invention.

FIG. 24 is a cross sectional view showing the schematic structure of a blue semiconductor laser according to a fifteenth embodiment of this invention. In this case, the structure near the mesa structure is enlarged and shown.

On an n-GaN contact layer (Si doped: $1 \times 10^{18}$ $cm^{-3}$) 450, an $n$-$Al_{0.08}Ga_{0.92}N$ clad layer (Si doped: $1 \times 10^{18}$ $cm^{-3}$, 0.6 μm) 451 and an active layer portion 452 including a multiple quantum well structure (MQW), Al cap layer and optical guide layer are formed. The active layer portion 452 has optical guide layers formed of GaN with a thickness of 0.1 μm on both sides thereof, the well layer is formed of an $In_{0.15}Ga_{0.85}N$ layer with a thickness of 3 nm, and the barrier layer is formed of an $In_{0.02}Ga_{0.98}N$ layer with a thickness of 6 nm. The well layer is formed with a five-layered structure. A $p$-$Al_{0.20}Ga_{0.80}N$ thin film barrier layer with a thickness of 2 nm is formed between the MQW layer and the p-side guide layer. On the active layer portion 452, a $p$-$Al_{0.08}Ga_{0.92}N$ clad layer (Mg doped: $5 \times 10^{19}$ $cm^{-3}$, 0.6 μm) 453 and p-GaN contact layer (Mg doped: $8 \times 10^{19}$ $cm^{-3}$, 0.2 μm) 454 are formed and the top portion of the contact layer 454 is doped with Mg at a high impurity concentration of $2 \times 10^{20}$ $cm^{-3}$. A p-side electrode 457 formed of Pt/Ti/Pt/Au is formed on the contact layer 454.

An optical absorption layer 459 which is the main portion of this embodiment is formed on the rear surface of the contact layer 450 and has the multiple quantum well (MQW) structure. The well layer is formed of an $In_{0.20}Ga_{0.80}N$ layer with a thickness of 3 nm and the barrier layer is formed of a GaN layer with a thickness of 6 nm. The well layer is formed with a ten-layered structure. Like the thirteenth and fourteenth embodiments, all of the nitride layers are grown and formed by use of the MOCVD method. The growth condition is also the same.

Optical absorption layers 461 holding the clad layer 453 therebetween are formed on the active layer portion 452 and are also the main portion of this embodiment like the optical absorption layer-459, and each of them is formed with an n-type MQW structure (well layer: $Si$-$In_{0.20}Ga_{0.80}N$ layer with a thickness of 3 nm, barrier layer: Si—GaN layer with a thickness of 6 nm, the well layer is formed with a ten-layered structure) and p-GaN contact layers 462 (Mg doped: $8 \times 10^{19}$ $cm^{-3}$, 0.5 μm) are grown thereon. The optical absorption layer 461 and contact layer 462 were formed by use of the selective growth method by the MOCVD method. At this time, the temperature was set at 800° C.

In the structure of this embodiment, all of the transverse mode control layer structures are formed of semiconductor layers for both of the horizontal transverse mode and vertical transverse mode, and this is advantageous for dimension control and the reliability can be enhanced. In this embodiment, the continuous oscillation at room temperatures was obtained with the threshold current of 75 mA. The oscillation wavelength was 405 nm and the operation voltage was 5.5V. The beam characteristic was unimodal and the astigmatic difference of 10 μm or less was obtained with the yield 95% or more.

This invention is not limited to the thirteenth to fifteenth embodiments, and SiC can be used for the semiconductor layer and substrate and II–VI group chemical compound semiconductor, Si, Ge may be used. In this example, an object layer is formed of AlGaN, but it is possible to contain an element such as In, Ti, Si, C, Ni to such an impurity concentration that it will not make a mixed crystal. The structure may be variously modified if it does not affect the threshold value of the laser. Further, it is possible to apply the laser to the other field of optical devices such as the waveguide structure and light receiving element.

[Sixteenth Embodiment]

Figure 25:
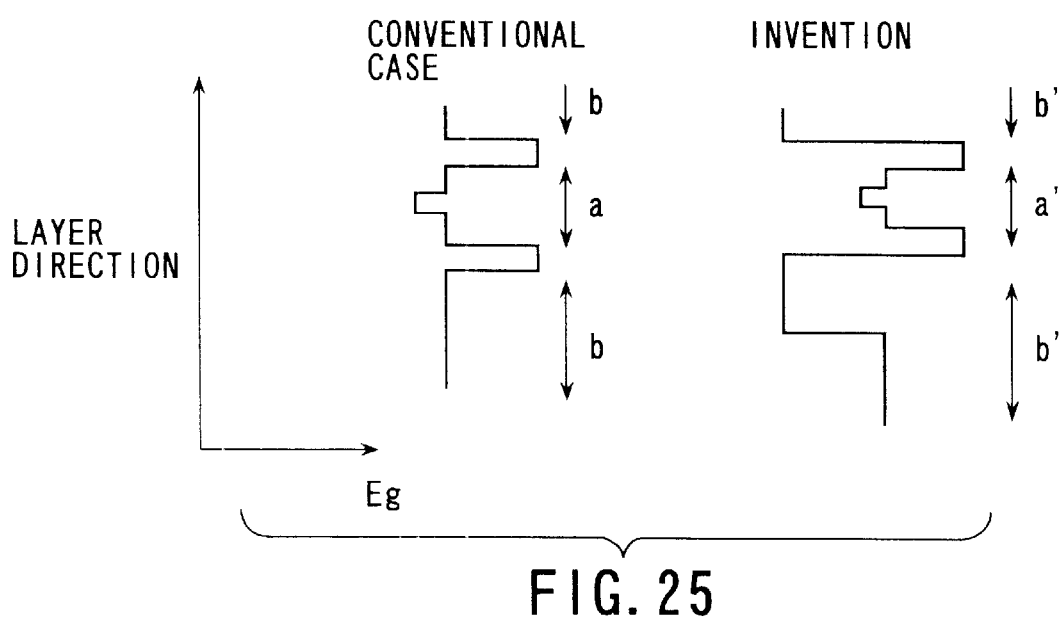
FIG. 25 is a diagram for illustrating the operations in sixteenth to eighteenth embodiments of this invention.

In the sixteenth to eighteenth embodiments described below, an InGaAlN layer containing As or P, or containing As and P is formed on the electrode bonding portion in the laser structure having an InGaAlN layer below the electrode portion, but use of this structure has an important meaning. That is, as shown in FIG. 25, if this structure is used for the structure in which a light emitting portion "a" has substantially no bandgap with respect to an electrode portion "b" in the conventional case, a structure in which "a" has a large bandgap difference with respect to "b'" can be obtained. In this structure, the bandgap difference becomes large, and as a result, a difference in the refractive index becomes large and no light leaks from the clad layer, and therefore, the electromagnetic distribution of light is confined with the active layer set as the center and the optical confinement is significantly improved. Thus, a semiconductor laser device in which the mode is stable and the oscillation threshold value is small can be obtained.

Figure 26:
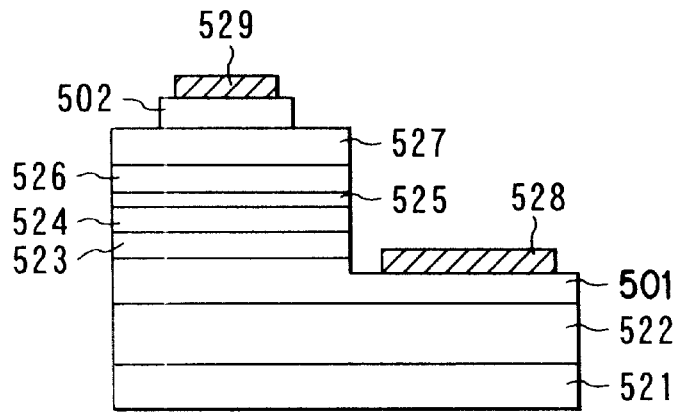
FIG. 26 is a cross sectional view showing the schematic structure of a semiconductor laser according to the sixteenth embodiment of this invention.

FIG. 26 is a cross sectional view showing the schematic structure of a semiconductor laser according to the sixteenth embodiment of this invention.

On a sapphire substrate 521, an n-type GaN layer 522, contact layer 501, n-type AlGaN clad layer 523, undoped GaN optical guide layer 524, quantum well layer 525 formed of InGaN/InGaN, p-type GaN optical guide layer 526, p-type AlGaN clad layer 527 and contact layer 502 are laminated. An n-side electrode 528 is formed on the contact layer 501, a p-side electrode 529 is formed on the contact layer 502, and the widths thereof are narrowed to 3 µm.

That is, in this embodiment, the contact layers 501, 502 containing As in the electrode contact portions are formed in addition to the basic structure.

The contact layer 501 is formed of an n-type GaNAs layer and the contact layer 502 is formed of a p-type GaNAs layer.

The MOCVD method is used for crystal growth and the growth temperature is lowered by 200° C. with respect to the other films only when the contact layers 501, 502 are grown. After the completion of growth of all of the layers, a resist is formed to pattern the same and an n-side electrode bonding layer is exposed by dry etching. Further, a p-side electrode bonding layer is partly narrowed.

In the laser of this embodiment, a bandgap difference between the light emitting region and the electrode portion side region is made large and a difference in the refractive index between the regions can be increased. Therefore, no light leaks from the clad layer, the optical confinement is improved, and as a result, the threshold value can be reduced. The threshold current density of the laser with the above structure is 1 kA/cm² and is one-fifth or less of the conventional case.

[Seventeenth Embodiment]

Figure 27:
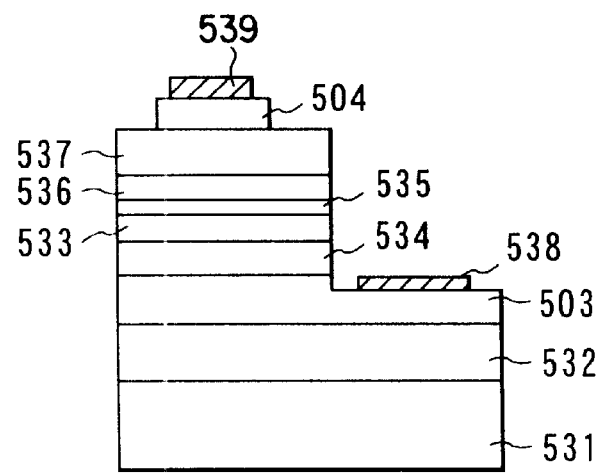
FIG. 27 is a cross sectional view showing the schematic structure of a semiconductor laser according to the seventeenth embodiment of this invention.

FIG. 27 is a cross sectional view showing the schematic structure of a semiconductor laser according to a seventeenth embodiment of this invention.

On a sapphire substrate 531, an n-type GaN layer 532, n-type GaNP layer 503, undoped GaN optical guide layer 534, n-type AlGaN clad layer 533, and quantum well layer 535 formed of InGaN/InGaN are laminated. Further, on the quantum well layer 535, a p-type GaN optical guide layer 536, p-type AlGaN clad layer 537 and p-type GaNP layer 504 are laminated. An n-side electrode 538 is formed on the n-type GaNP layer 503, a p-side electrode 539 is formed on the p-type GaNP layer 504, and the width of the p-side electrode 539 is narrowed to 3 µm.

The MOCVD method is used for crystal growth and the growth temperature is lowered by 200° C. with respect to the other films only when the contact layers 503, 504 are grown. The threshold current density of the laser with the above structure is 1 kA/cm² and is one-fifth or less of the conventional case.

[Eighteenth Embodiment]

Figure 28:
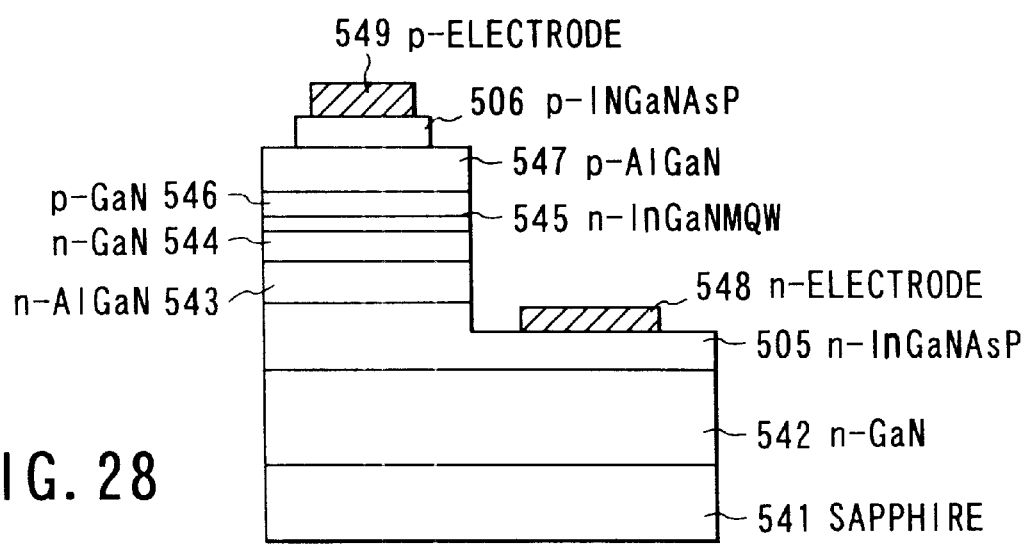
FIG. 28 is a cross sectional view showing the schematic structure of a semiconductor laser according to the eighteenth embodiment of this invention.

FIG. 28 is a cross sectional view showing the schematic structure of a semiconductor laser according to an eighteenth embodiment of this invention.

On a sapphire substrate 541, an n-type-GaN layer 542, n-type InGaNAsP layer 505, n-type AlGaN clad layer 543, undoped GaN optical guide layer 544 and quantum well layer 545 formed of InGaN/InGaN are laminated. Further, on the quantum well layer 545, a p-type GaN optical guide layer 546, p-type AlGaN clad layer 547 and p-type InGaNAsP layer 506 are laminated. An n-side electrode 548 is formed on the n-type InGaNAsP layer 505, a p-side electrode 549 is formed on the p-type InGaNAsP layer 506, and the width of the p-side electrode 549 is narrowed to 3 µm.

The MOCVD method is used for crystal growth and the growth temperature is lowered by 200° C. with respect to the other films only when the contact layers 505, 506 are grown. The threshold current density of the laser with the above structure is 1 kA/cm² and is one-fifth or less of the conventional case.

This invention is not limited to the sixteenth to eighteenth embodiments described above. In this embodiment, GaN series materials are used as the materials, but the materials can be adequately changed according to the specification. Further, it is possible to integrate a plurality of elements on the same substrate. In addition, the embodiment can be variously modified without departing from the technical scope of this invention.

[Nineteenth Embodiment]

Figure 29:
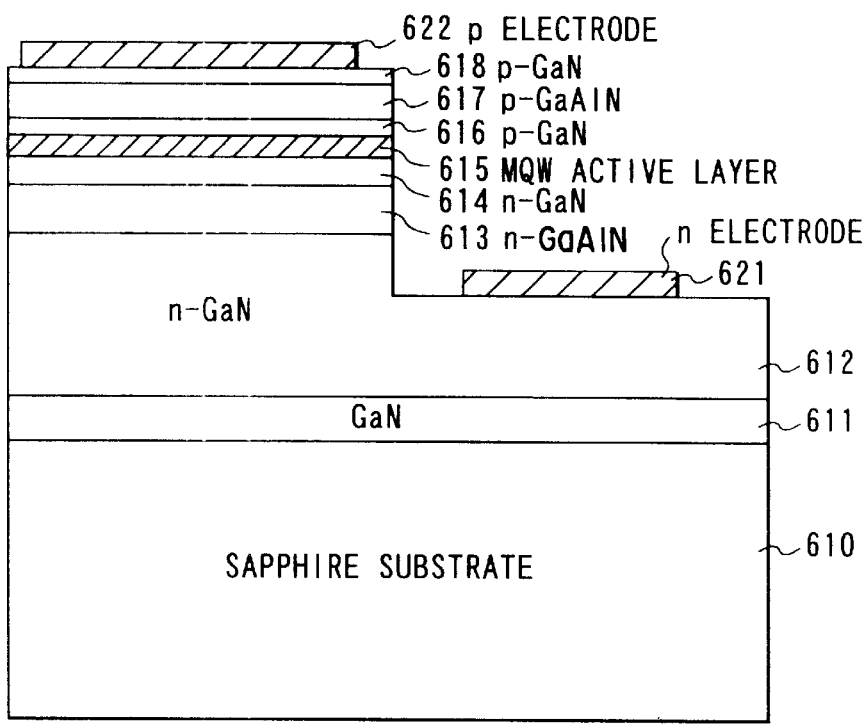
FIG. 29 is a cross sectional view showing the element structure of a semiconductor laser according to the nineteenth embodiment of this invention.

FIG. 29 is a cross sectional view showing the element structure of a semiconductor laser according to a nineteenth embodiment of this invention.

On a sapphire substrate 610, a buffer layer 611, n-type contact layer 612, n-type clad layer 613, n-type guide layer 614, active layer 615, p-type guide layer 616, p-type clad layer 617 and p-type contact layer 618 are formed and a p-side electrode 622 is formed on the upper surface of the p-type contact layer 618. The buffer layer 611 is formed of GaN, the n-type contact layer 612 is formed of Si doped n-GaN, the n-type clad layer 613 is formed of Si doped n-GaAlN, and the n-type guide layer 614 is formed of Si doped n-GaN. The active layer 615 has a multiple quantum well (MQW) structure constructed by a periodic structure in which two types of InAlGaN layers having different bandgap energy and a thickness of 10 nm or less are alternately laminated. Further, the p-type guide layer 616 is formed of Mg doped p-GaN, the p-type clad layer 617 is formed of Mg doped p-AlGaN and the p-type contact layer 618 is formed of Mg doped GaN.

A portion ranging from the p-type contact layer 618 to the intermediate portion of the n-type contact layer 612 is partly etched and an n-side electrode 621 is formed on the exposed surface of the n-type contact layer 612.

In this example, the p-type guide layer 616, p-type clad layer 617 and p-type contact layer 618 are formed with the following thicknesses. The p-type guide layer 616 is formed with a thickness of 0.1 µm. The p-type clad layer 617 is formed of $Al_{0.15}Ga_{0.85}N$ with a thickness of 0.05 µm or less and can be omitted. The p-type contact layer 618 is formed of GaN with a thickness of 0.05 µm or less and can be omitted.

Figure 30:
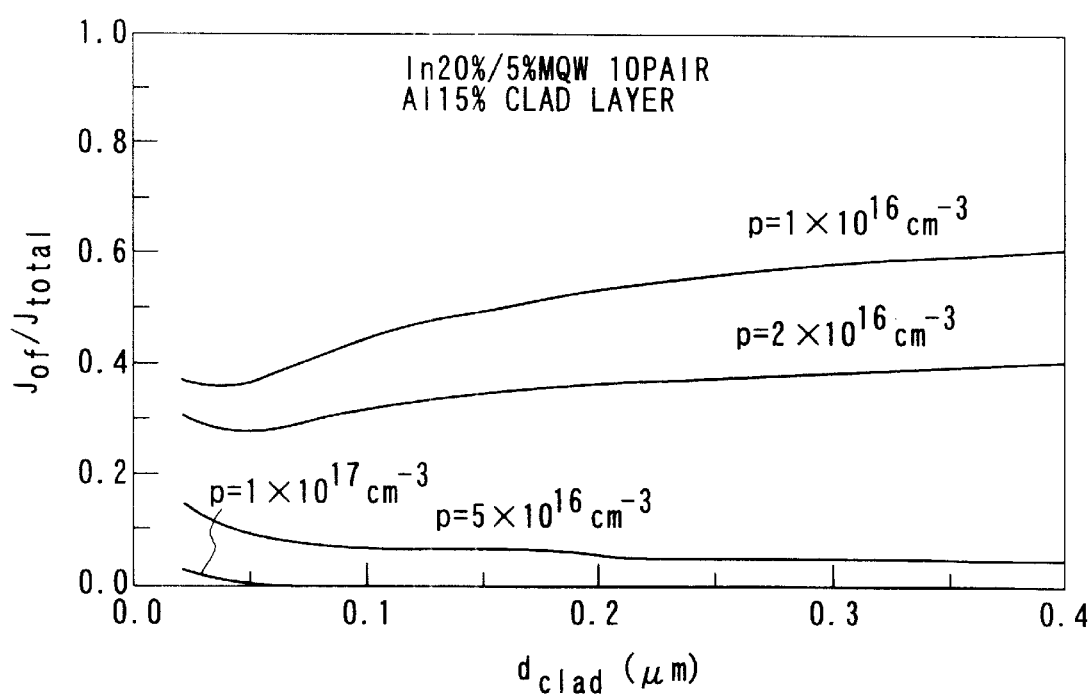
FIG. 30 is a diagram showing the dependency of the carrier overflow on the thickness of the clad layer.

As in this embodiment, if the p-type clad layer 617 is formed with a thickness of 0.05 μm or less, the carrier overflow is reduced in comparison with a case wherein the clad layer is made thick as shown in FIG. 30.

Figure 34:
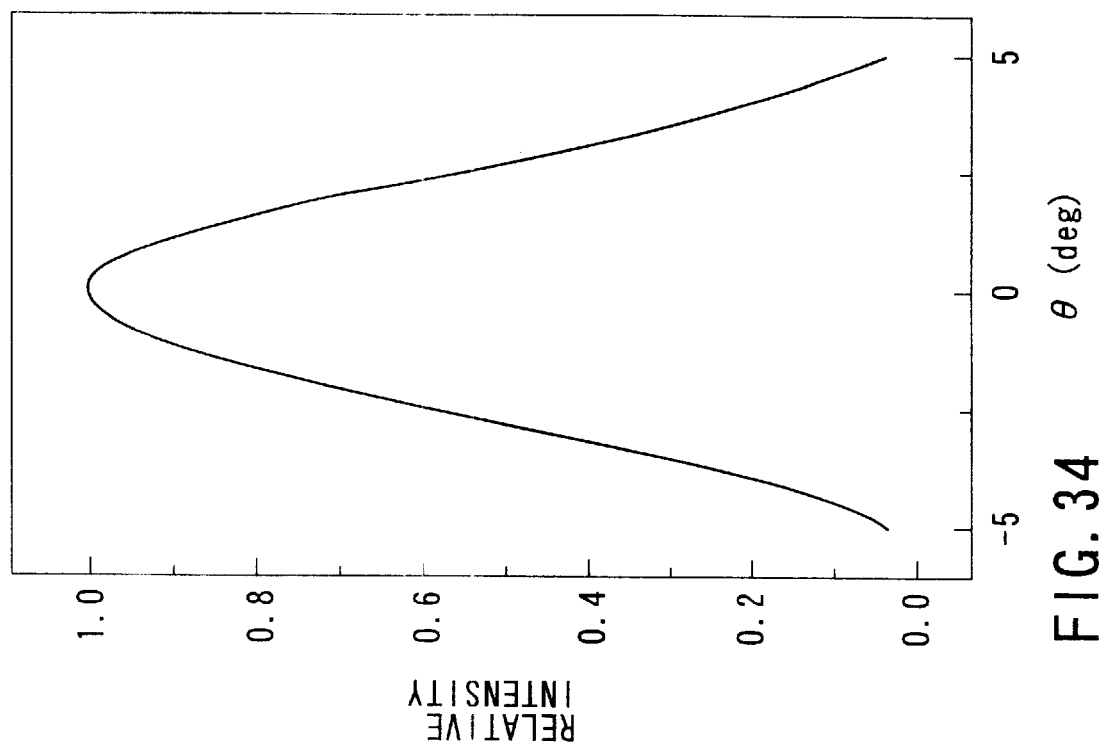
FIG. 34 is a diagram showing FFP in the laser oscillation in the sixteenth embodiment of this invention.
Figure 33:
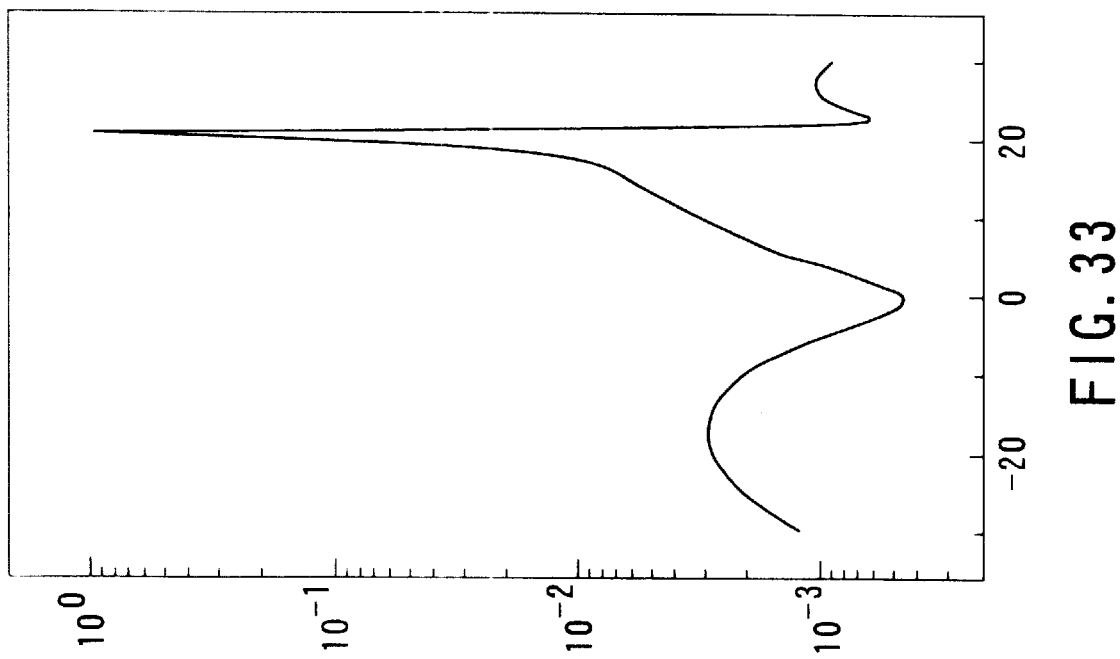
FIG. 33 is a diagram showing FFP in the laser oscillation in the conventional structure.

The conventional FFP exhibits the multi-modal characteristic as shown in FIG. 33. Each peak corresponds to the optical confinement of the p-GaN contact layer 618 and n-GaN contact layer 612. However, FFP exhibits the unimodal characteristic as shown in FIG. 34 by making the p-GaN contact layer 618 thin as in this embodiment.

The semiconductor laser of this embodiment thus obtained continuously oscillates at room temperatures with the wavelength approximately equal to 420 nm, the threshold current density thereof is 1 kA/cm$^2$ or less and FFP exhibits the unimodal characteristic at the time of laser oscillation.

[Twentieth Embodiment]

Next, a semiconductor laser according to a twentieth embodiment of this invention is explained. The basic structure is the same as that shown in FIG. 29 of the nineteenth embodiment and the twentieth embodiment is different from the nineteenth embodiment in the structures of the p-type guide layer 616, p-type clad layer 617 and p-type contact layer 618.

The thicknesses of the above layers are set as follows. The p-type guide layer 616 is formed with a thickness of 0.02 μm or less and can be omitted. The p-type clad layer 617 is formed of $Al_{0.15}Ga_{0.85}N$ with a thickness of 0.35 μm. The p-type contact layer 618 is formed of GaN with a thickness of 0.05 μm or less and can be omitted.

Figure 31:
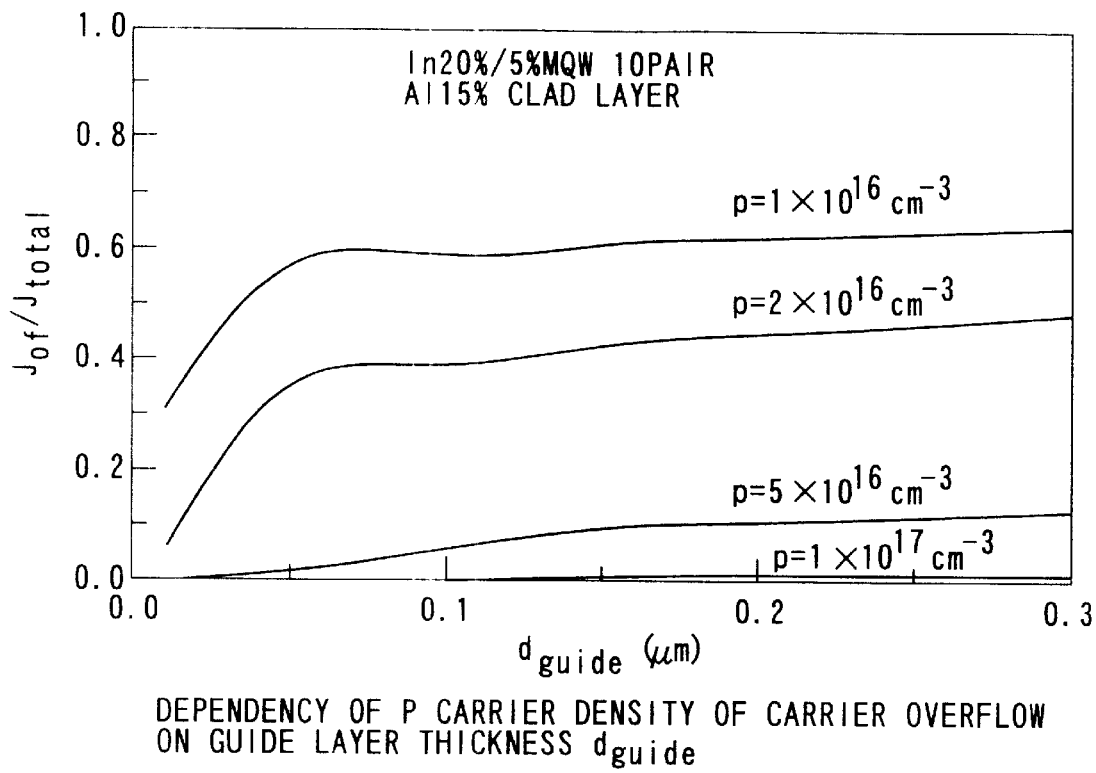
FIG. 31 is a diagram showing the dependency of the carrier overflow on the thickness of the guide layer.

As in this embodiment, if the guide layer 616 is formed with a thickness of 0.02 μm or less, the carrier overflow is reduced in comparison with a case wherein the guide layer is made thick as shown in FIG. 31. The semiconductor laser thus obtained continuously oscillates at room temperatures with the wavelength approximately equal to 420 nm, the threshold current density thereof is 1 kA/cm$^2$ or less and FFP exhibits the unimodal characteristic at the time of laser oscillation.

[Twenty-first Embodiment]

Next, a semiconductor laser according to a twenty-first embodiment of this invention is explained. The basic structure is the same as that shown in FIG. 29 of the nineteenth embodiment and the twenty-first embodiment is different from the nineteenth embodiment in the structure of the p-type guide layer 616.

The p-type guide layer 616 of this embodiment is formed of Mg doped p-AlGaN or InGaN. That is, the composition of the p-type guide layer 616 is not limited to GaN but contains In by 5% or more or Al by 5% or more. The p-type contact layer 618 is formed of GaN with a thickness of 0.05 μm or less and can be omitted.

Figure 32:
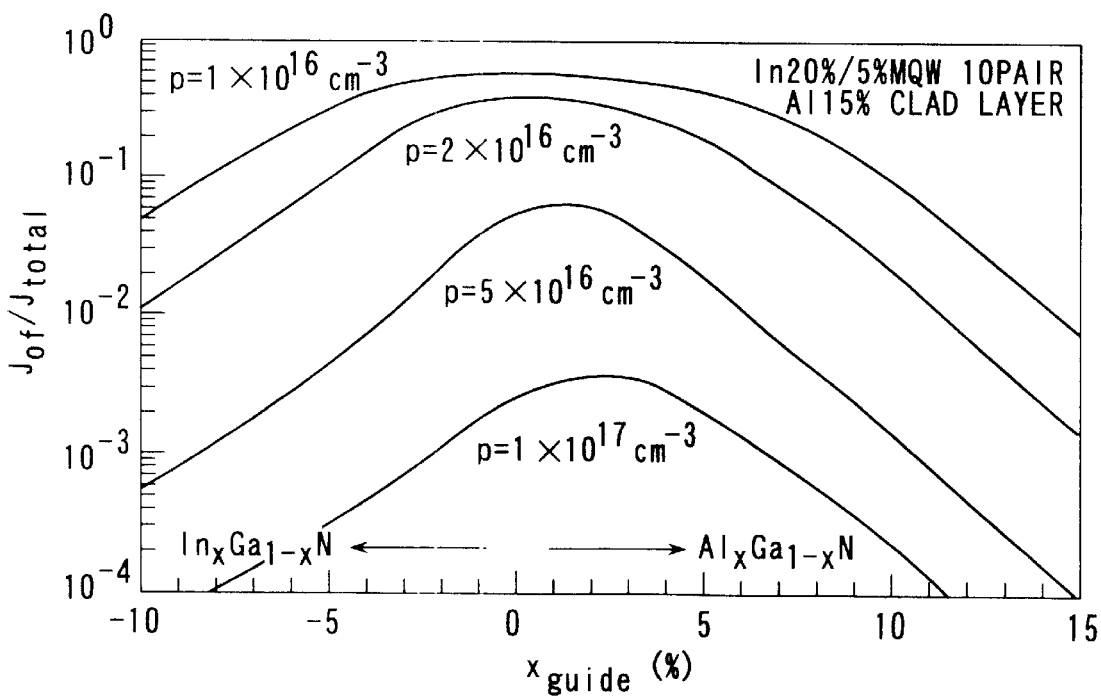
FIG. 32 is a diagram showing the dependency of the carrier overflow on the composition of the guide layer.

FIG. 32 shows the result of calculation for the carrier overflow in a case wherein the composition of the guide layer is changed from GaN. It is understood that the carrier overflow is more reduced as the composition of the guide layer is more deviated from GaN. This can be considered because the hetero barrier between the active layer and the guide layer becomes larger when the composition of the guide layer is formed of AlGaN or the hetero barrier between the guide layer and the clad layer becomes larger when the composition of the guide layer is formed of InGaN and the carrier overflow is reduced.

According to the nineteenth to twenty-first embodiments, the carrier overflow is reduced by making the p-type guide layer or p-type clad layer thin and making the p-type contact layer thin and the loss occurring in the p-type guide layer, p-type clad layer and p-type contact layer is reduced by reducing the optical confinement coefficients of the above layers so that the threshold value can be reduced. Further, since the optical confinement coefficient of the p-type contact layer is reduced, the multi-modal characteristic of FFP at the time of laser oscillation can be suppressed. By the above effects, a gallium nitride series compound semiconductor laser of high reliability which can be operated on a low voltage with a small threshold value and used for the optical disk or the like can be provided.

As described above in detail, according to this invention, a gallium nitride series compound semiconductor laser of high reliability which can be operated on a low voltage with a small threshold value and used for the optical disk or the like and in which occurrence of cracks is suppressed and FFP exhibits a unimodal characteristic can be provided.

More specifically, according to the first to fifth embodiments, the oscillation in the high-order mode can be suppressed to obtain a unimodal characteristic of FFP and thus the oscillation threshold value can be reduced by forming a layer of small refractive index formed of, for example, AlGaN of small refractive index or an optical absorption layer of InGaN or the like on the surface of the clad layer constituting the double hetero structure which is opposite to the active layer.

In the sixth and seventh embodiments, the transverse mode is an anti-index guided mode, but light leaking to the exterior of the clad layer can be absorbed by forming an optical absorption layer which is transparent with respect to oscillation light on the exterior of the clad layers having different conductivity types and holding the active layer therebetween. Further, leakage light can be absorbed by use of the optical absorption layer obtained by growth in a buried form in the horizontal direction of the active layer with the anti-index guided structure. As a result, the wave front in the resonator becomes perpendicular to the resonator direction, FFP exhibits the unimodal characteristic, the spread angle can be suppressed, and the astigmatic difference can be made small.

According to the eighth to twelfth embodiments, light having passed through the clad layer can be abruptly attenuated by the optical absorption layer and the optical confinement mode can be easily attained at the time of laser oscillation by forming optical absorption layers which attain lattice matching with respect to the thickest layer in the element on both sides of the double hetero structure and have bandgap energy smaller than the energy of light emitted from the active layer. Thus, a laser in which FFP exhibits unimodal characteristic and which can be used for the optical disk or laser projector can be attained.

According to the thirteenth to fifteenth embodiments, light leaking from the active layer to the substrate can be sufficiently absorbed by forming the optical absorption layer containing In having bandgap smaller than the bandgap of the active layer on the substrate side with respect to the double hetero structure, thereby making it possible to reduce the threshold value and stabilize the transverse mode.

According to the sixteenth to eighteenth embodiments, a large bandgap difference can be obtained between the active layer and the electrode portion by forming the contact layer of InGaAlN containing As, P below the electrode portion, thereby making it possible to eliminate light which leaks from the clad layer so as to improve the optical confinement characteristic, stabilize the mode and reduce the oscillation threshold value.

According to the nineteenth to twenty-first embodiments, the carrier overflow can be reduced and the carrier injection coefficient can be enhanced by making the p-side guide layer or p-side clad layer thinner than that on the n side. Therefore, the carrier injection coefficient in the active layer can be enhanced and the threshold value can be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor laser using gallium nitride series compound semiconductor and having a double hetero structure including an active layer held between clad layers of different conductivity types, comprising:

contact layers of different conductivity types formed to hold said double hetero structure, the conductivity types of said clad layer and contact layer adjacent to each other being the same; and at least one light leakage preventing layer formed in at least one of said contact layers and having an optical property different from that of said contact layer, for preventing light from leaking from said clad layer into said contact layer.

2. A semiconductor laser according to claim 1, wherein said light leakage preventing layer includes a plurality of optical absorption layers having a larger optical absorption coefficient than said clad layer.

3. A semiconductor laser according to claim 2, wherein at least one optical absorption layers is formed adjacent to said clad layer.

4. A semiconductor laser according to claim 2, wherein said plurality of optical absorption layers are formed of a desired composition of GaInAlBN.

5. A semiconductor laser according to claim 2, wherein said plurality of optical absorption layers includes one of InAlGaN and InGaN.

6. A semiconductor laser according to claim 1, wherein said light leakage preventing layer includes a layer of small refractive index having a smaller refractive index than said clad layer.

7. A semiconductor laser according to claim 6, wherein said layer of small refractive index includes one of InAlGaN and AlGaN.

8. A semiconductor laser according to claim 1, wherein said light leakage preventing layer includes a first optical absorption layer having a larger optical absorption coefficient than said clad layer and a layer of small refractive index having a smaller refractive index than said first optical absorption layer and said clad layer.

9. A semiconductor laser according to claim 8, wherein said first optical absorption layer is formed adjacent to said clad layer and said layer of small refractive index is formed in position farther apart from said clad layer than said first optical absorption layer.

10. A semiconductor laser according to claim 9, further comprising a current block layer opened in a stripe form and formed in said contact layer provided between said first optical absorption layer and said layer of small refractive index, and a second optical absorption layer provided in the current block layer and having a higher optical absorption coefficient than said clad layer.

11. A semiconductor laser according to claim 8, wherein said optical absorption layer is formed of a desired composition of GaInAlBN.

12. A semiconductor laser according to claim 8, wherein said optical absorption layer includes one of InAlGaN and InGaN.

13. A semiconductor laser according to claim 1, wherein said light leakage preventing layer includes at least one optical absorption layer having a higher optical absorption coefficient than said clad layer and at least one layer of small refractive index having a smaller refractive index than said optical absorption layer and said clad layer, and said optical absorption layer and said layer of small refractive index are located at a node and loop of waveguide mode of said contact layers, respectively.

14. A semiconductor laser according to claim 1, wherein said light leakage preventing layer includes a plurality of layers of small refractive index and said plurality of layers of small refractive index are arranged at irregular intervals in at least one of said contact layers to suppress occurrence of a high-order mode.

15. A semiconductor laser according to claim 1, wherein said light leakage preventing layer includes a plurality of layers of small refractive index and said plurality of layers of small refractive index are arranged at a regular interval in at least one of said contact layers to fix the order of a high-order mode.

16. A semiconductor laser according to claim 1, wherein said light leakage preventing layer includes a plurality of layers of small refractive index and said plurality of layers of small refractive index are arranged in position at a distance substantially equal to an integral multiple of the minimum interval in at least one of said contact layers to fix the order of a high-order mode.

17. A semiconductor laser according to claim 1, wherein at least one of said contact layers has a super lattice structure.

18. A semiconductor laser according to claim 1, wherein said active layer has a multiple quantum well structure.

19. A semiconductor laser according to claim 1, in which a mesa portion shaped like a stripe is provided in said active layer in order to inject carriers into said active layer, and which further comprises optical absorption layers made of nitride series semiconductor and provided at two sides of said mesa portion, respectively.

20. A semiconductor laser according to claim 1, which further comprises electrodes connected to said contact layers, respectively, and in which a junction between each contact layer and one electrode contains at least one of element selected from the group consisting of As and P.

* * * * *